US012772884B2

(12) United States Patent
Patil et al.

(10) Patent No.: US 12,772,884 B2
(45) Date of Patent: Oct. 20, 2026

(54) PACKAGE COMPRISING AN INTEGRATED DEVICE AND A METALLIZATION PORTION WITH VARIABLE THICKNESS METALLIZATION INTERCONNECTS ON A SAME METAL LAYER

(71) Applicant: QUALCOMM Incorporated, San Diego, CA (US)

(72) Inventors: Aniket Patil, San Diego, CA (US); Brigham Navaja, San Diego, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 413 days.

(21) Appl. No.: 18/460,471

(22) Filed: Sep. 1, 2023

(65) Prior Publication Data

US 2024/0321709 A1 Sep. 26, 2024

Related U.S. Application Data

(60) Provisional application No. 63/491,985, filed on Mar. 24, 2023.

(51) Int. Cl.

| | |
|---|---|
| ***H10W 70/65*** | (2026.01) |
| ***H10W 70/60*** | (2026.01) |
| ***H10W 70/685*** | (2026.01) |
| ***H10W 90/00*** | (2026.01) |
| *H10W 74/00* | (2026.01) |

(52) U.S. Cl.
CPC .......... *H10W 70/65* (2026.01); *H10W 70/611* (2026.01); *H10W 70/685* (2026.01); *H10W 90/00* (2026.01); *H10W 74/00* (2026.01); *H10W 90/724* (2026.01); *H10W 90/794* (2026.01)

(58) Field of Classification Search
CPC ... H10W 70/65; H10W 70/685; H10W 90/00; H10W 70/611
See application file for complete search history.

(56) References Cited

U.S. PATENT DOCUMENTS

2014/0021617 A1 1/2014 Lu et al.
2016/0071807 A1 3/2016 Hsu et al.
(Continued)

FOREIGN PATENT DOCUMENTS

WO 2017105446 A1 6/2017

OTHER PUBLICATIONS

Partial International Search Report—PCT/US2024/018642—ISA/EPO—Jul. 1, 2024.
(Continued)

*Primary Examiner* — Michael Jung
(74) *Attorney, Agent, or Firm* — Loza & Loza, LLP

(57) ABSTRACT

A package comprising an integrated device and a metallization portion. The metallization portion comprises at least one dielectric layer and a plurality of metallization interconnects. The plurality of metallization interconnects comprise a first metallization interconnect located on a first metal layer and a second metallization interconnect located on the first metal layer. The first metallization interconnect includes a first thickness. The second metallization interconnect includes a second thickness that is different from the first thickness. The package may include a substrate and/or a bridge. The substrate may include an interposer.

14 Claims, 20 Drawing Sheets

CROSS SECTIONAL PROFILE VIEW

(56) References Cited

U.S. PATENT DOCUMENTS

| | | | | |
|---|---|---|---|---|
| 2021/0305141 | A1 | 9/2021 | Patil et al. | |
| 2022/0352076 | A1* | 11/2022 | Ecton | H10W 70/611 |
| 2023/0085646 | A1* | 3/2023 | Ecton | H01L 23/5385<br>257/773 |
| 2023/0087367 | A1* | 3/2023 | Sun | H01L 23/5389<br>257/774 |
| 2023/0087810 | A1 | 3/2023 | Ecton et al. | |
| 2023/0420413 | A1* | 12/2023 | Nitsch | H01L 25/0652 |
| 2024/0030145 | A1* | 1/2024 | Kang | H01L 25/0655 |
| 2024/0063127 | A1* | 2/2024 | Ecton | H01L 25/0655 |
| 2025/0070075 | A1* | 2/2025 | Chiang | H01L 23/49816 |

OTHER PUBLICATIONS

Ramadan T., “Dissolving The Barriers In Multi-Substrate 3D-IC Assembly Design”, Semiconductor Engineering, Feb. 24, 2022, XP093174772, pp. 1-7, Figure 1.

International Search Report and Written Opinion—PCT/US2024/018642—ISA/EPO—Aug. 22, 2024.

* cited by examiner

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

PACKAGE COMPRISING AN INTEGRATED DEVICE AND A METALLIZATION PORTION WITH VARIABLE THICKNESS METALLIZATION INTERCONNECTS ON A SAME METAL LAYER

CROSS-REFERENCE TO RELATED APPLICATION

This application claims priority to and the benefit of Provisional Application Ser. No. 63/491,985 filed in the United States Patent and Trademark Office on Mar. 24, 2023, the entire content of which is incorporated herein by reference as if fully set forth below in its entirety and for all applicable purposes.

FIELD

Various features relate to a package comprising an integrated device and a metallization portion.

BACKGROUND

A package may include a package substrate and an integrated device. These components are coupled together to provide a package that may perform various electrical functions. How the integrated device and the package substrate are coupled together affects how the package performs overall. There is an ongoing need to provide better performing packages.

SUMMARY

Various features relate to a package comprising an integrated device and a package substrate.

One example provides a package comprising an integrated device; a substrate coupled to the integrated device through at least a first plurality of solder interconnects; and a metallization portion coupled to the substrate through at least a second plurality of solder interconnects. The metallization portion comprises at least one dielectric layer; and a plurality of metallization interconnects. The plurality of metallization interconnects comprises a first metallization interconnect located on a first metal layer, wherein the first metallization interconnect includes a first thickness; and a second metallization interconnect located on the first metal layer, wherein the second metallization interconnect includes a second thickness that is different from the first thickness.

Another example provides a package that includes a first integrated device, a second integrated device, a bridge coupled to the first integrated device and the second integrated device and a metallization portion coupled to the first integrated device and the second integrated device. The metallization portion comprises at least one dielectric layer and a plurality of metallization interconnects. The plurality of metallization interconnects comprise a first metallization interconnect located on a first metal layer and a second metallization interconnect located on the first metal layer. The first metallization interconnect includes a first thickness. The second metallization interconnect includes a second thickness that is different from the first thickness.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising an integrated device; a substrate coupled to the integrated device through at least a first plurality of solder interconnects; and a metallization portion coupled to the substrate through at least a second plurality of solder interconnects. The metallization portion comprises at least one dielectric layer; and a plurality of metallization interconnects. The plurality of metallization interconnects comprises a first metallization interconnect located on a first metal layer, wherein the first metallization interconnect includes a first thickness; and a second metallization interconnect located on the first metal layer, wherein the second metallization interconnect includes a second thickness that is different from the first thickness.

In some implementations, a package that includes a first integrated device, a second integrated device, a bridge coupled to the first integrated device and the second integrated device and a metallization portion coupled to the first integrated device and the second integrated device. The metallization portion comprises at least one dielectric layer and a plurality of metallization interconnects. The plurality of metallization interconnects comprise a first metallization interconnect located on a first metal layer and a second metallization interconnect located on the first metal layer. The first metallization interconnect includes a first thickness. The second metallization interconnect includes a second thickness that is different from the first thickness.

As will be further described below, the use of metallization interconnects with different thicknesses in the metallization portion provides several technical advantages, including the ability to customize and optimize the metallization interconnects for the type of signals and/or power that will travel through the metallization interconnects, which can help provide a package with improved performance.

Exemplary Package Comprising an Integrated Device and a Metallization Portion

Figure 1:
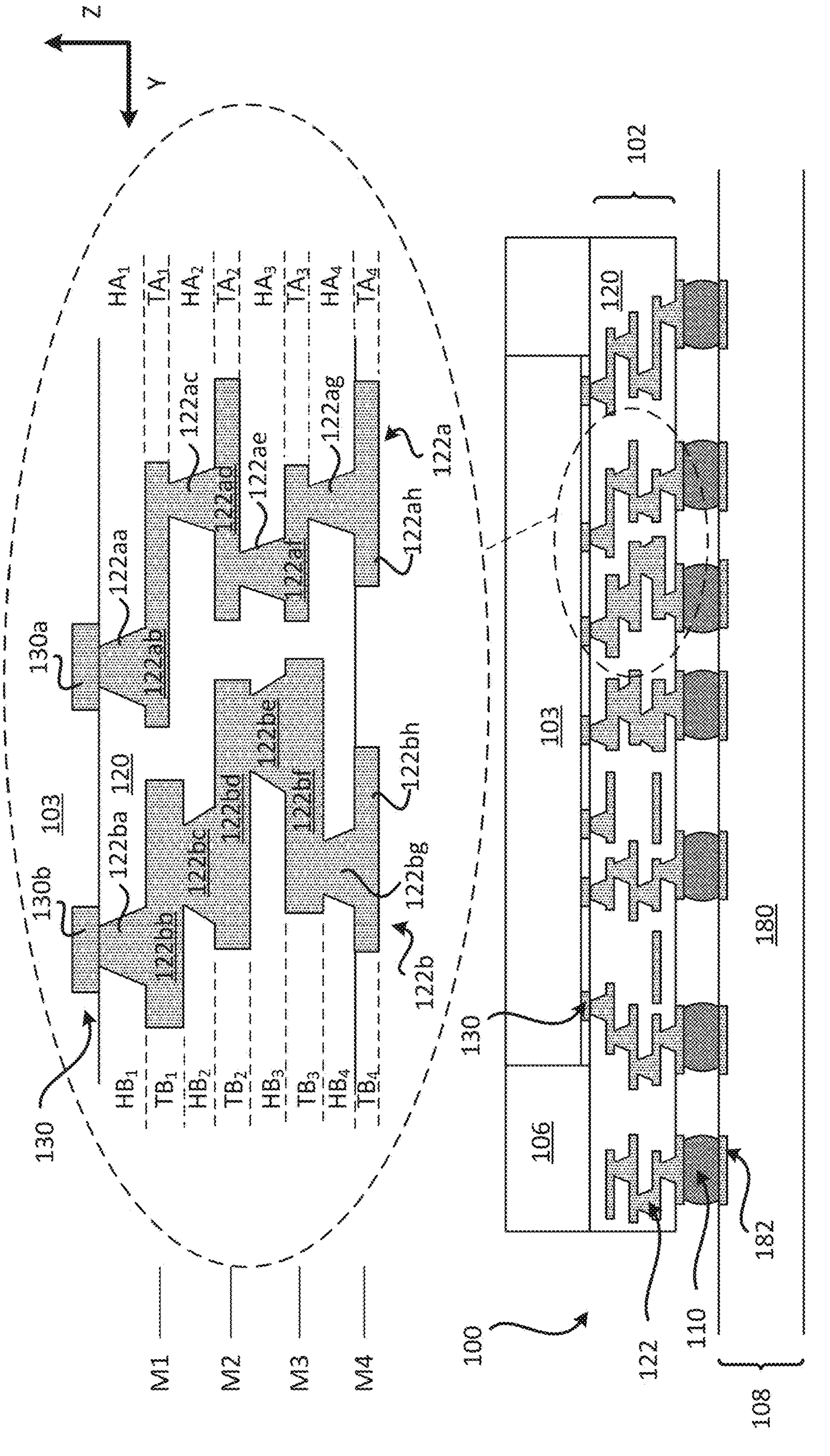
FIG. 1 illustrates a cross sectional profile view of an exemplary package comprising an integrated device and a metallization portion.

FIG. 1 illustrates a cross sectional profile view of a package 100 that includes a metallization portion with metallization interconnects with different thicknesses. The package 100 is coupled to a board 108 through a plurality of solder interconnects 110. The board 108 includes at least one board dielectric layer 180 and a plurality of board interconnects 182. The board 108 may include a printed circuit board (PCB).

The package 100 includes a metallization portion 102, an integrated device 103 and an encapsulation layer 106. The integrated device 103 is coupled to a first surface of the metallization portion 102. The integrated device 103 may be a first integrated device. The integrated device 103 may be bare die (e.g., semiconductor bare die). The integrated device 103 is coupled to the metallization portion 102. The front side of the integrated device 103 may face the metallization portion 102. The encapsulation layer 106 may encapsulate the integrated device 103. The encapsulation layer 106 may be coupled to the first surface of the metallization portion 102. An encapsulation layer (e.g., 106) may include a mold, a resin and/or an epoxy. The encapsulation layer may be a means for encapsulation. The encapsulation layer may be provided by using a compression and transfer molding process, a sheet molding process, or a liquid molding process.

The metallization portion 102 includes at least one dielectric layer 120 and a plurality of metallization interconnects 122. The plurality of metallization interconnects 122 may include a first plurality of metallization interconnects 122*a* and a second plurality of metallization interconnects 122*b*. The first plurality of metallization interconnects 122*a* include a metallization interconnect 122*aa*, a metallization interconnect 122*ab*, a metallization interconnect 122*ac*, a metallization interconnect 122*ad*, a metallization interconnect 122*ae*, a metallization interconnect 122*af*, a metallization interconnect 122*ag*, and a metallization interconnect 122*ah*. The second plurality of metallization interconnects 122*b* include a metallization interconnect 122*ba*, a metallization interconnect 122*bb*, a metallization interconnect 122*bc*, a metallization interconnect 122*bd*, a metallization interconnect 122*be*, a metallization interconnect 122*bf*, a metallization interconnect 122*bg*, and a metallization interconnect 122*bh*.

The metallization interconnect 122*aa* is coupled to the metallization interconnect 122*ab*. The metallization interconnect 122*ab* is coupled to the metallization interconnect 122*ac*. The metallization interconnect 122*ac* is coupled to the metallization interconnect 122*ad*. The metallization interconnect 122*ad* is coupled to the metallization interconnect 122*ac*. The metallization interconnect 122*ac* is coupled to the metallization interconnect 122*af*. The metallization interconnect 122*af* is coupled to the metallization interconnect 122*ag*. The metallization interconnect 122*ag* is coupled to the metallization interconnect 122*ah*. The metallization interconnect 122*aa*, the metallization interconnect 122*ac*, the metallization interconnect 122*ae* and the metallization interconnect 122*ag* may include metallization vias (e.g., via interconnects, metallization via interconnects). The metallization interconnect 122*ab*, the metallization interconnect 122*ad*, the metallization interconnect 122*af* and the metallization interconnect 122*ah* may include metallization pads and/or metallization traces.

The metallization interconnect 122*ba* is coupled to the metallization interconnect 122*bb*. The metallization interconnect 122*bb* is coupled to the metallization interconnect 122*bc*. The metallization interconnect 122*bc* is coupled to the metallization interconnect 122*bd*. The metallization interconnect 122*bd* is coupled to the metallization interconnect 122*be*. The metallization interconnect 122*be* is coupled to the metallization interconnect 122*bf*. The metallization interconnect 122*bf* is coupled to the metallization interconnect 122*bg*. The metallization interconnect 122*bg* is coupled to the metallization interconnect 122*bh*. The metallization interconnect 122*ba*, the metallization interconnect 122*bc*, the metallization interconnect 122*be* and/or the metallization interconnect 122*bg* may include metallization vias (e.g., via interconnects, metallization via interconnects). The metallization interconnect 122*bb*, the metallization interconnect 122*bd*, the metallization interconnect 122*bf* and/or the metallization interconnect 122*bh* may include metallization pads and/or metallization traces.

FIG. 1 illustrates that some metallization interconnects on the same metal layer (e.g., M1, M2, M3, M4) may have different thicknesses and/or metallization interconnects between the same metal layers may have different heights, widths and/or diameters. The metallization interconnect 122*aa* may have a height HA1. The metallization interconnect 122*ab* may have a thickness TA1. The metallization interconnect 122*ac* may have a height HA2. The metallization interconnect 122*ad* may have a thickness TA2. The metallization interconnect 122*ae* may have a height HA3. The metallization interconnect 122*af* may have a thickness TA3. The metallization interconnect 122*ag* may have a height HA4. The metallization interconnect 122*ah* may have a thickness TA4.

The metallization interconnect 122*ba* may have a height HB1. The metallization interconnect 122*bb* may have a thickness TB1. The metallization interconnect 122*bc* may have a height HB2. The metallization interconnect 122*bd* may have a thickness TB2. The metallization interconnect 122*be* may have a height HB3. The metallization interconnect 122*bf* may have a thickness TB3. The metallization interconnect 122*bg* may have a height HB4. The metallization interconnect 122*bh* may have a thickness TB4.

The metallization interconnect 122*ab* and the metallization interconnect 122*bb* are located on the same metal layer (e.g., M1). The thickness (TA1) of the metallization interconnect 122*ab* is less than the thickness (TB1) of the metallization interconnect 122*bb*. The metallization interconnect 122*ad* and the metallization interconnect 122*bd* are located on the same metal layer (e.g., M2). The thickness (TA2) of the metallization interconnect 122*ad* is less than the thickness (TB2) of the metallization interconnect 122*bd*. The metallization interconnect 122*af* and the metallization interconnect 122*bf* are located on the same metal layer (e.g., M3). The thickness (TA3) of the metallization interconnect

122*af* is less than the thickness (TB3) of the metallization interconnect 122*bb*. The metallization interconnect 122*ah* and the metallization interconnect 122*bh* are located on the same metal layer (e.g., M4). The thickness (TA4) of the metallization interconnect 122*ah* is about the same as the thickness (TB4) of the metallization interconnect 122*bh*.

The metallization interconnect 122*aa* may have a height HA1 that is about the same as the height HB1 of the metallization interconnect 122*ba*. The metallization interconnect 122*aa* may have a width and/or diameter that is about the same as the width and/or diameter of the metallization interconnect 122*ba*. The metallization interconnect 122*ac* and the metallization interconnect 122*bc* may be located between the same metal layers (e.g., between M1 and M2). The metallization interconnect 122*ac* may have a height HA2 that is greater than the height HB2 of the metallization interconnect 122*bc*. The metallization interconnect 122*ac* may have a width and/or diameter that is less than the width and/or diameter of the metallization interconnect 122*bc*. The metallization interconnect 122*ae* and the metallization interconnect 122*be* may be located between the same metal layers (e.g., between M2 and M3). The metallization interconnect 122*ae* may have a height HA3 that is greater than the height HB3 of the metallization interconnect 122*be*. The metallization interconnect 122*ae* may have a width and/or diameter that is less than the width and/or diameter of the metallization interconnect 122*be*. The metallization interconnect 122*ag* and the metallization interconnect 122*bg* may be located between the same metal layers (e.g., between M3 and M4). The metallization interconnect 122*ag* may have a height HA4 that is greater than the height HB4 of the metallization interconnect 122*bg*. The metallization interconnect 122*ag* may have a width and/or diameter that is less than the width and/or diameter of the metallization interconnect 122*bg*.

As an example, in some implementations, the minimum thickness (e.g., TA1, TA2, TA3, TA4) of one or more interconnects (e.g., 122*ab*, 122*ad*, 122*af*) may be in a range of about 5-10 micrometers. In some implementations, the minimum height (e.g., HA2, HA3, HA4) of one or more via interconnects (e.g., 122*ac*, 122*ae*, 122*ag*) may be in a range of about 7-20 micrometers. In some implementations, the minimum thickness (e.g., TB1, TB2, TB3, TB4) of one or more interconnects (e.g., 122*bb*, 122*bd*, 122*bf*) may be in a range of about 7-20 micrometers. In some implementations, the minimum height (e.g., HB2, HB3, HB4) of one or more via interconnects (e.g., 122*bc*, 122*be*, 122*bg*) may be in a range of about 5-15 micrometers. In some implementations, one or more interconnects (e.g., trace interconnects) may have a minimum width of about 2 micrometers.

It is noted that the above minimum thicknesses, minimum heights, minimum widths and/or minimum diameters are exemplary. Different implementations may have metallization interconnects with different thicknesses, heights, widths and/or diameters (e.g., different minimum thicknesses, minimum heights, minimum widths and/or minimum diameters). Moreover, different implementations may have metallization interconnects with different relative thicknesses, relative heights, relative widths and/or relative diameters. In some implementations, metallization interconnects on a same metal layer may have one metallization interconnect that has a thickness that is at least 1.2 greater than the thickness of another metallization interconnect on the same layer. For example, the metallization interconnect 122*bb* may have a thickness TB1 that is at least 1.5 greater than the thickness TA1 of the metallization interconnect 122*ab*.

In some implementations, it may be optimal, preferred and/or more ideal to have metallization interconnects that are thicker, to allow more current to pass through, with less resistance. For example, when metallization interconnects are configured as an electrical path for power, it may be desirable to have thicker metallization interconnects so that there is less resistance in the electrical path, which may allow more power to travel to an integrated device. In contrast, metallization interconnects that are configured to provide electrical paths for signals (e.g., input/output (I/O) signals) may not need to be as big and/or thick since input/output signals operate at a lower voltage, and thus the dimensions (e.g., line width, line thickness) do not need to be a big as those of metallization interconnects configured to provide an electrical path for power.

Thus, the thickness and/or height of various metallization interconnects may be configured to optimize for the type of current that will travel through the metallization interconnects in the metallization portion. In one example, metallization interconnects that are configured to provide an electrical path for power, may have on higher thicknesses and/or greater widths and/or diameters than interconnects configured to provide electrical paths for signals. In another example, metallization interconnects that are configured to provide an electrical path for input/output signals, may have the smallest possible thickness, widths and/or diameters and/or thickness, widths and/or diameters that are smaller than interconnects configured to provide electrical paths for power and/or ground.

The integrated device 103 includes a die interconnect 130*a* and a die interconnect 130*b*. The die interconnect 130*a* and/or the die interconnect 130*b* may be a die pad for the integrated device 103. The die interconnect 130*a* is coupled to and touching the metallization interconnect 122*aa* of the metallization portion 102. The die interconnect 130*b* is coupled to and touching the metallization interconnect 122*ba* of the metallization portion 102.

The metallization interconnect 122*ah* may be coupled to and touching a solder interconnect from the plurality of solder interconnects 110. The metallization interconnect 122*bh* may be coupled to and touching another solder interconnect from the plurality of solder interconnects 110.

In some implementations, an electrical path between the board 108 and the integrated device 103 may include a board interconnect from the plurality of board interconnects 182, a solder interconnect from the plurality of solder interconnects 110, the first plurality of metallization interconnects 122*a*, and the die interconnect 130*a*.

In some implementations, an electrical path for input/output signals, between the board 108 and the integrated device 103, may include a board interconnect from the plurality of board interconnects 182, a solder interconnect from the plurality of solder interconnects 110, the first plurality of metallization interconnects 122*a*, and the die interconnect 130*a*.

In some implementations, an electrical path for power or ground, between the board 108 and the integrated device 103, may include a board interconnect from the plurality of board interconnects 182, a solder interconnect from the plurality of solder interconnects 110, the first plurality of metallization interconnects 122*b*, and the die interconnect 130*a*.

Figure 2:
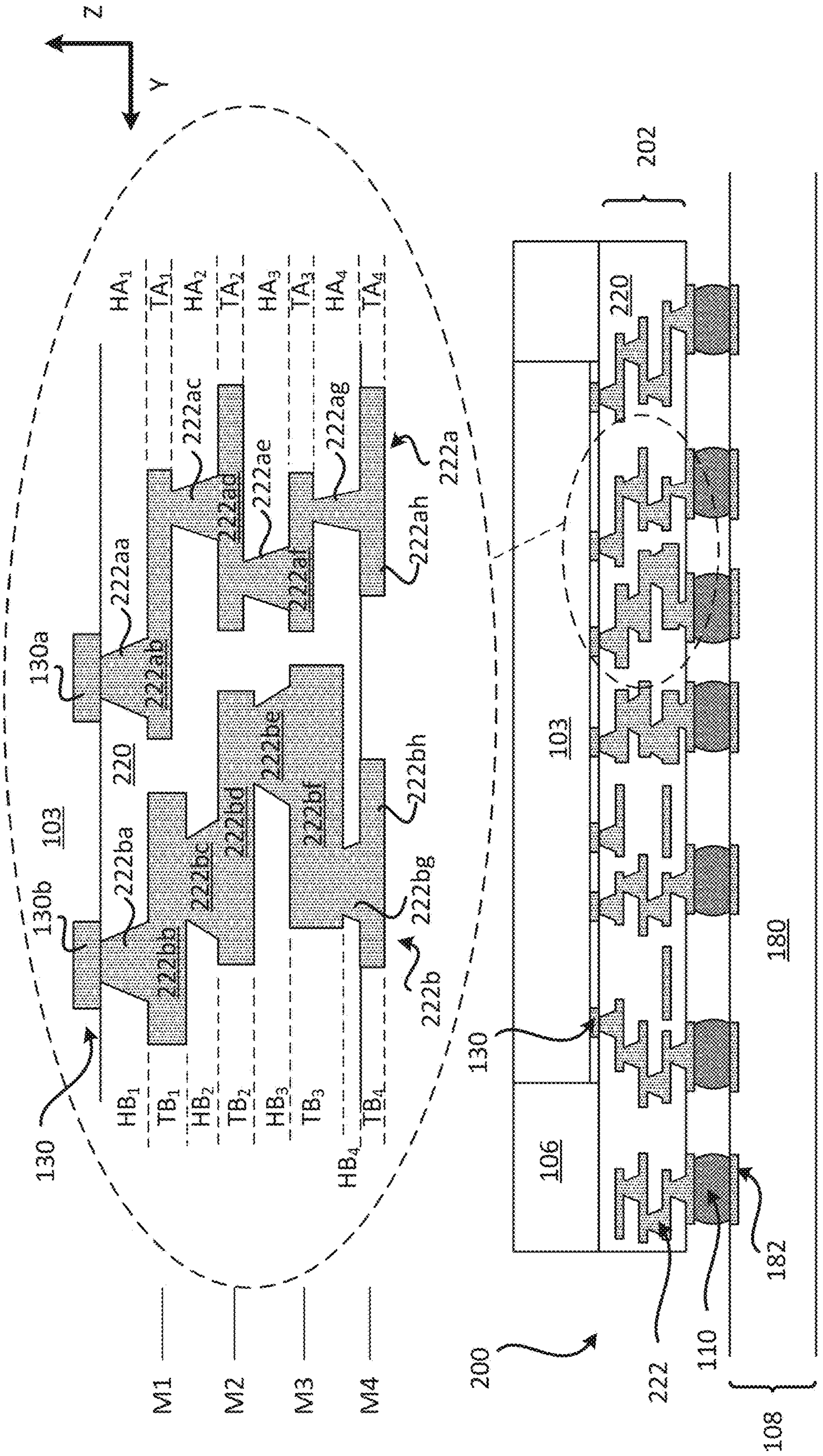
FIG. 2 illustrates a cross sectional profile view of an exemplary package comprising an integrated device and a metallization portion.

FIG. 2 illustrates a cross sectional profile view of a package 200 that includes a metallization portion with metallization interconnects with different thicknesses. The package 200 is similar to the package 100, and includes similar components as the package 100. However, the package 200 includes a metallization interconnects with different combinations of thicknesses.

The package 200 includes a metallization portion 202, an integrated device 103 and an encapsulation layer 106. The integrated device 103 is coupled to a first surface of the metallization portion 202. The integrated device 103 may be a first integrated device. The integrated device 103 is coupled to the metallization portion 202. The front side of the integrated device 103 may face the metallization portion 202. The encapsulation layer 106 may encapsulate the integrated device 103. The encapsulation layer 106 may be coupled to the first surface of the metallization portion 202.

The metallization portion 202 includes at least one dielectric layer 220 and a plurality of metallization interconnects 222. The plurality of metallization interconnects 222 may include a first plurality of metallization interconnects 222*a* and a second plurality of metallization interconnects 222*b*. The first plurality of metallization interconnects 222*a* includes a metallization interconnect 222*aa*, a metallization interconnect 222*ab*, a metallization interconnect 222*ac*, a metallization interconnect 222*ad*, a metallization interconnect 222*ae*, a metallization interconnect 222*af*, a metallization interconnect 222*ag*, and a metallization interconnect 222*ah*. The second plurality of metallization interconnects 222*b* includes a metallization interconnect 222*ba*, a metallization interconnect 222*bb*, a metallization interconnect 222*bc*, a metallization interconnect 222*bd*, a metallization interconnect 222*be*, a metallization interconnect 222*bf*, a metallization interconnect 222*bg*, and a metallization interconnect 222*bh*.

The metallization interconnect 222*aa* is coupled to the metallization interconnect 222*ab*. The metallization interconnect 222*ab* is coupled to the metallization interconnect 222*ac*. The metallization interconnect 222*ac* is coupled to the metallization interconnect 222*ad*. The metallization interconnect 222*ad* is coupled to the metallization interconnect 222*ac*. The metallization interconnect 222*ac* is coupled to the metallization interconnect 222*af*. The metallization interconnect 222*af* is coupled to the metallization interconnect 222*ag*. The metallization interconnect 222*ag* is coupled to the metallization interconnect 222*ah*. The metallization interconnect 222*aa*, the metallization interconnect 222*ac*, the metallization interconnect 222*ac* and/or the metallization interconnect 222*ag* may include metallization vias. The metallization interconnect 222*ab*, the metallization interconnect 222*ad*, the metallization interconnect 222*af* and/or the metallization interconnect 222*ah* may include metallization pads and/or metallization traces.

The metallization interconnect 222*ba* is coupled to the metallization interconnect 222*bb*. The metallization interconnect 222*bb* is coupled to the metallization interconnect 222*bc*. The metallization interconnect 222*bc* is coupled to the metallization interconnect 222*bd*. The metallization interconnect 222*bd* is coupled to the metallization interconnect 222*be*. The metallization interconnect 222*be* is coupled to the metallization interconnect 222*bf*. The metallization interconnect 222*bf* is coupled to the metallization interconnect 222*bg*. The metallization interconnect 222*bg* is coupled to the metallization interconnect 222*bh*. The metallization interconnect 222*ba*, the metallization interconnect 222*bc*, the metallization interconnect 222*be* and/or the metallization interconnect 222*bg* may include metallization vias. The metallization interconnect 222*bb*, the metallization interconnect 222*bd*, the metallization interconnect 222*bf* and/or the metallization interconnect 222*bh* may include metallization pads and/or metallization traces.

FIG. 2 illustrates that some metallization interconnects on the same metal layer (e.g., M1, M2, M3, M4) may have different thicknesses and/or metallization interconnects between the same metal layers may have different heights, widths and/or diameters. The metallization interconnect 222*aa* may have a height HA1. The metallization interconnect 222*ab* may have a thickness TA1. The metallization interconnect 222*ac* may have a height HA2. The metallization interconnect 222*ad* may have a thickness TA2. The metallization interconnect 222*ae* may have a height HA3. The metallization interconnect 222*af* may have a thickness TA3. The metallization interconnect 222*ag* may have a height HA4. The metallization interconnect 222*ah* may have a thickness TA4.

The metallization interconnect 222*ba* may have a height HB1. The metallization interconnect 222*bb* may have a thickness TB1. The metallization interconnect 222*bc* may have a height HB2. The metallization interconnect 222*bd* may have a thickness TB2. The metallization interconnect 222*be* may have a height HB3. The metallization interconnect 222*bf* may have a thickness TB3. The metallization interconnect 222*bg* may have a height HB4. The metallization interconnect 222*bh* may have a thickness TB4.

The metallization interconnect 222*ab* and the metallization interconnect 222*bb* are located on the same metal layer (e.g., M1). The thickness (TA1) of the metallization interconnect 222*ab* is less than the thickness (TB1) of the metallization interconnect 222*bb*. The metallization interconnect 222*ad* and the metallization interconnect 222*bd* are located on the same metal layer (e.g., M2). The thickness (TA2) of the metallization interconnect 222*ad* is less than the thickness (TB2) of the metallization interconnect 222*bd*. The metallization interconnect 222*af* and the metallization interconnect 222*bf* are located on the same metal layer (e.g., M3). The thickness (TA3) of the metallization interconnect 222*af* is less than the thickness (TB3) of the metallization interconnect 222*bb*. The metallization interconnect 222*ah* and the metallization interconnect 222*bh* are located on the same metal layer (e.g., M4). The thickness (TA4) of the metallization interconnect 222*ah* is about the same as the thickness (TB4) of the metallization interconnect 222*bh*.

The metallization interconnect 222*aa* may have a height HA1 that is about the same as the height HB1 of the metallization interconnect 222*ba*. The metallization interconnect 222*aa* may have a width and/or diameter that is about the same as the width and/or diameter of the metallization interconnect 222*ba*. The metallization interconnect 222*ac* and the metallization interconnect 222*bc* may be located between the same metal layers (e.g., between M1 and M2). The metallization interconnect 222*ac* may have a height HA2 that is greater than the height HB2 of the metallization interconnect 222*bc*. The metallization interconnect 222*ac* may have a width and/or diameter that is less than the width and/or diameter of the metallization interconnect 222*bc*. The metallization interconnect 222*ae* and the metallization interconnect 222*be* may be located between the same metal layers (e.g., between M2 and M3). The metallization interconnect 222*ae* may have a height HA3 that is greater than the height HB3 of the metallization interconnect 222*be*. The metallization interconnect 222*ae* may have a width and/or diameter that is less than the width and/or diameter of the metallization interconnect 222*be*. The metallization interconnect 222*ag* and the metallization interconnect 222*bg* may be located between the same metal layers (e.g., between M3 and M4). The metallization interconnect 222*ag* may have a height HA4 that is greater than the height HB4 of the metallization interconnect 222*bg*. The metallization interconnect 222*ag* may have a width and/or diameter that is less than the width and/or diameter of the metallization interconnect 222*bg*. As an example, a first via metallization interconnect (e.g., 222*ac*) may include a first minimum diameter, and second via metallization interconnect (e.g., 222*bc*) may include a second minimum diameter that is greater than the first minimum diameter.

FIG. 2 illustrates that the relative thickness of a metallization interconnect to another metallization interconnect on the same metal layer may be different for different metal layers. For example, for a first metal layer (e.g., M1) of the metallization portion 202, the metallization interconnect 222*bb* may have a thickness TB1 that is at least 1.2 times thicker than the thickness TA1 for the metallization interconnect 222*ab*. In another example, for a second metal layer (e.g., M2) of the metallization portion 202, the metallization interconnect 222*bd* may have a thickness TB2 that is at least 1.5 times thicker than the thickness TA2 for the metallization interconnect 222*ad*. In another example, for a third metal layer (e.g., M3) of the metallization portion 202, the metallization interconnect 222*bf* may have a thickness TB3 that is at least 2 times thicker than the thickness TA3 for the metallization interconnect 222*af*. In another example, for a fourth metal layer (e.g., M4) of the metallization portion 202, the metallization interconnect 222*bh* may have a thickness TB4 that is about the same as the thickness TA4 for the metallization interconnect 222*ah*. However, it is noted that the above thicknesses, heights, widths and/or diameters are exemplary. Different implementations may have metallization interconnects with different thicknesses, different heights, different widths and/or different diameters. Moreover, different implementations may have metallization interconnects with different relative thicknesses, relative heights, relative widths and/or relative diameters.

Figure 3:
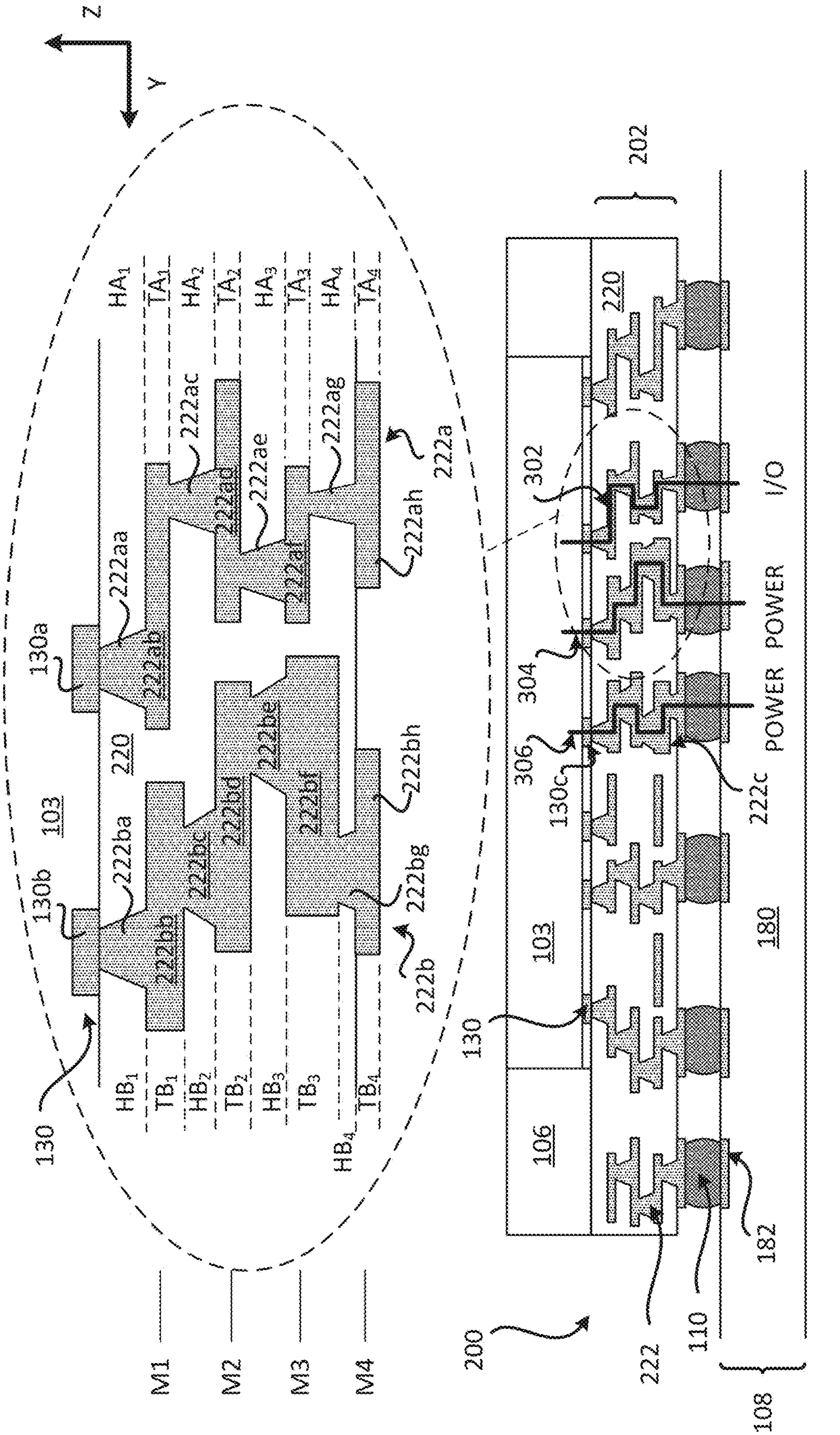
FIG. 3 illustrates a cross sectional profile view of an exemplary package comprising an integrated device and a metallization portion.

FIG. 3 illustrates exemplary electrical paths for the package 200. For example, FIG. 3 illustrates an electrical path 302 between the integrated device 103 and the board 108, an electrical path 304 between the integrated device 103 and the board 108, and an electrical path 306 between the integrated device 103 and the board 108. The electrical path 302 between the integrated device 103 and the board 108 may include a board interconnect from the plurality of board interconnects 182, a solder interconnect from the plurality of solder interconnects 110, the first plurality of metallization interconnects 222*a*, and the die interconnect 130*a*. The electrical path 302 may be configured to provide an electrical path for input/output signals.

The electrical path 304 between the integrated device 103 and the board 108 may include another board interconnect from the plurality of board interconnects 182, another solder interconnect from the plurality of solder interconnects 110, the second plurality of metallization interconnects 222*b*, and the die interconnect 130*b*. The electrical path 304 may be configured to provide an electrical path for power or ground.

The electrical path 306 between the integrated device 103 and the board 108 may include another board interconnect from the plurality of board interconnects 182, another solder interconnect from the plurality of solder interconnects 110, a third plurality of metallization interconnects 222*c*, and the die interconnect 130*c*. The electrical path 306 may be configured to provide an electrical path for power or ground. The third plurality of metallization interconnects 222*c* may be similar to the second plurality of metallization interconnects 222*b*, in that they have metallization interconnects on the same metal layer with different thicknesses.

Figure 4:
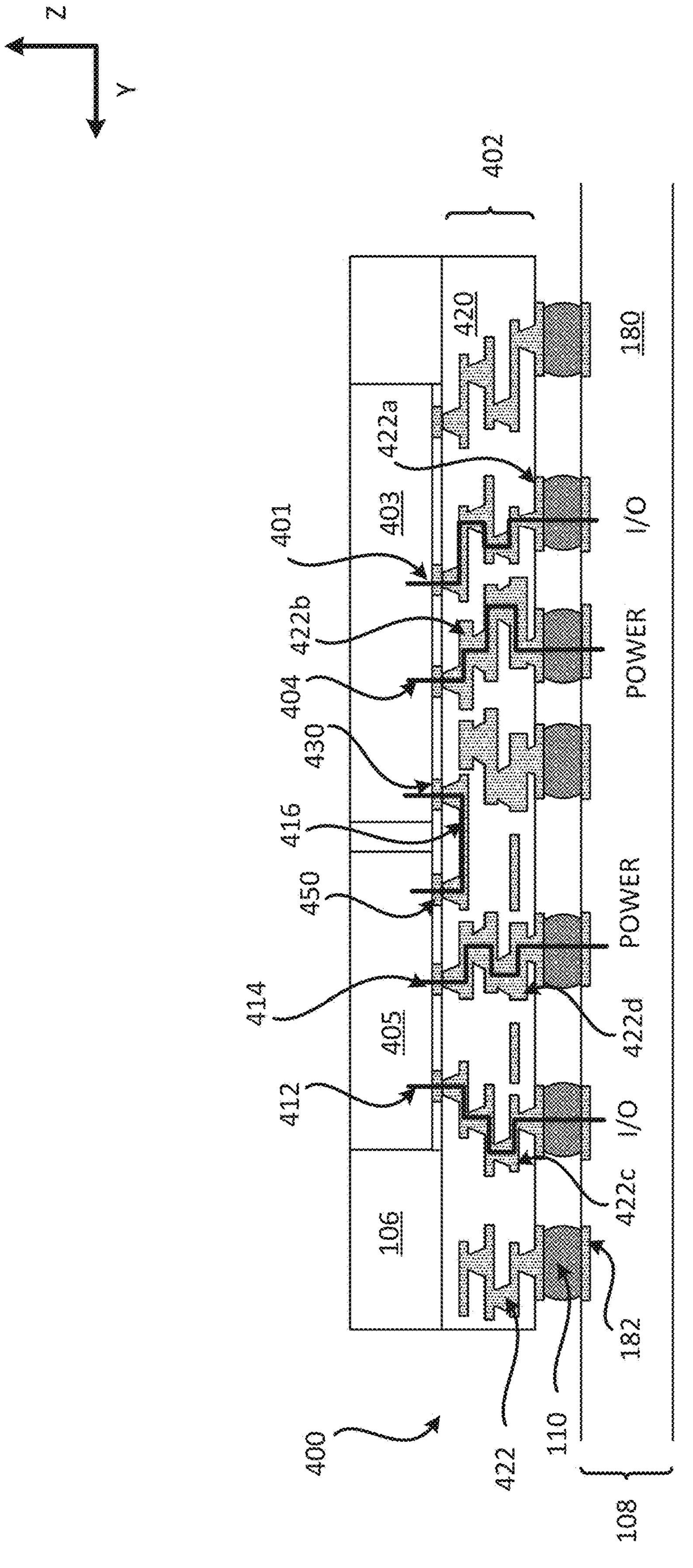
FIG. 4 illustrates a cross sectional profile view of an exemplary package comprising a first integrated device, a second integrated device and a metallization portion.

FIG. 4 illustrates a package that includes a metallization portion with metallization interconnects with different thicknesses. The package 400 includes a metallization portion 402, an integrated device 403, an integrated device 405 and an encapsulation layer 106. The integrated device 403 is coupled to a first surface of the metallization portion 402. The integrated device 405 is coupled to a first surface of the metallization portion 402. The integrated device 403 may be bare die (e.g., semiconductor bare die). The integrated device 405 may be bare die (e.g., semiconductor bare die). The integrated device 403 may be a first integrated device (e.g., first chiplet), and the integrated device 405 may be a second integrated device (e.g., second chiplet). The integrated device 403 and the integrated device 405 are coupled to and touching the metallization portion 402. The front side of the integrated device 403 may face the metallization portion 402. The front side of the integrated device 405 may face the metallization portion 402. The encapsulation layer 106 may encapsulate the integrated device 403 and the integrated device 405. The encapsulation layer 106 may be coupled to the first surface of the metallization portion 402. The integrated device 403 may be configured to perform a first plurality of functions and/or operations. The integrated device 405 may be configured to perform a second plurality of functions and/or operations. The second plurality of functions and/or operations includes at least one function and/or operation that is different from the first plurality of functions and/or operations.

The metallization portion 402 includes at least one dielectric layer 420 and a plurality of metallization interconnects 422. The plurality of metallization interconnects 422 may include a first plurality of metallization interconnects 422*a*, a second plurality of metallization interconnects 422*b*, a third plurality of metallization interconnects 422*c*, and a fourth plurality of metallization interconnects 422*d*.

The first plurality of metallization interconnects 422*a* may be similar to the first plurality of metallization interconnects 122*a* and/or the first plurality of metallization interconnects 222*a*. The third plurality of metallization interconnects 422*c* may be similar to the first plurality of metallization interconnects 122*a* and/or the first plurality of metallization interconnects 222*a*. The second plurality of metallization interconnects 422*b* may be similar to the second plurality of metallization interconnects 122*b* and/or the second plurality of metallization interconnects 222*b*. The fourth plurality of metallization interconnects 422*d* may be similar to the second plurality of metallization interconnects 122*b* and/or the second plurality of metallization interconnects 222*b*.

FIG. 4 illustrates exemplary electrical paths for a package, such as an electrical path 401, an electrical path 404, an electrical path 412 and an electrical path 414. An electrical path between the integrated device 403 and the board 108 may include the electrical path 401. The electrical path 401 may include a board interconnect from the plurality of board interconnects 182, a solder interconnect from the plurality of solder interconnects 110, the first plurality of metallization interconnects 422*a*, and a first die interconnect from the integrated device 403. The electrical path 401 may be configured to provide an electrical path for input/output signals.

An electrical path between the integrated device 403 and the board 108 may include the electrical path 404. The electrical path 404 may include another board interconnect from the plurality of board interconnects 182, another solder interconnect from the plurality of solder interconnects 110, the second plurality of metallization interconnects 422*b*, and a second die interconnect from the integrated device 403. The electrical path 404 may be configured to provide an electrical path for power or ground.

An electrical path between the integrated device 405 and the board 108 may include the electrical path 412. The electrical path 412 may include a board interconnect from the plurality of board interconnects 182, a solder interconnect from the plurality of solder interconnects 110, the third plurality of metallization interconnects 422*c*, and a first die interconnect from the integrated device 405. The electrical path 412 may be configured to provide an electrical path for input/output signals.

An electrical path between the integrated device 405 and the board 108 may include the electrical path 414. The electrical path 414 may include another board interconnect from the plurality of board interconnects 182, another solder interconnect from the plurality of solder interconnects 110, the fourth plurality of metallization interconnects 422*d*, and a second die interconnect from the integrated device 405. The electrical path 414 may be configured to provide an electrical path for power or ground.

An electrical path 416 between the integrated device 405 and the integrated device 403 may include a die interconnect from the integrated device 405, at least one metallization interconnect from the plurality of metallization interconnects 422 and a die interconnect from the integrated device 403.

A metallization portion may include a redistribution portion that includes redistribution interconnects (e.g., redistribution layer (RDL) interconnects). A redistribution interconnect may include portions that have a U-shape or V-shape. The terms "U-shape" and" V-shape" shall be interchangeable. The terms "U-shape" and "V-shape" may refer to the side profile shape of the interconnects and/or redistribution interconnects. The U-shape interconnect (e.g., U-shape side profile interconnect) and the V-shape interconnect (e.g., V-shape side profile interconnect) may have a top portion and a bottom portion. A bottom portion of a U-shape interconnect (or a V-shape interconnect) may be coupled to a top portion of another U-shape interconnect (or a V-shape interconnect).

An integrated device (e.g., 103, 403, 405) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SIC) based integrated device, a memory, power management processor, and/or combinations thereof. An integrated device (e.g., 103, 403, 405) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). As mentioned above, using several chiplets that perform several functions may reduce the overall cost of a package relative to using a single chip to perform all of the functions of a package. In some implementations, one or more of the chiplets and/or one of more of integrated devices (e.g., 103, 403, 405) described in the disclosure may be fabricated using the same technology node or two or more different technology nodes. For example, an integrated device (e.g., 403) may be fabricated using a first technology node, and a chiplet (e.g., 405) may be fabricated using a second technology node that is not as advanced as the first technology node. In such an example, the integrated device (e.g., 403) may include components (e.g., interconnects, transistors) that have a first minimum size, and the chiplet (e.g., 405) may include components (e.g., interconnects, transistors) that have a second minimum size, where the second minimum size is greater than the first minimum size. In some implementations, the integrated device 403 and the integrated device 405 of a package, may be fabricated using the same technology node or different technology nodes. In some implementations, a chiplet and another chiplet of a package, may be fabricated using the same technology node or different technology nodes.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advance technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

Exemplary Sequence for Fabricating a Package Comprising an Integrated Device and a Metallization Portion FIGS. 5A-5H illustrate an exemplary sequence for providing or fabricating a package that includes an integrated device and a metallization portion with metallization interconnects with different thicknesses. In some implementations, the sequence of FIGS. 5A-5H may be used to provide or fabricate the package 200 of FIG. 2, or any of the packages described in the disclosure.

It should be noted that the sequence of FIGS. 5A-5H may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 5A-5H may be used to fabricate one package or several packages at a time (as part of a wafer).

Figure 5A:
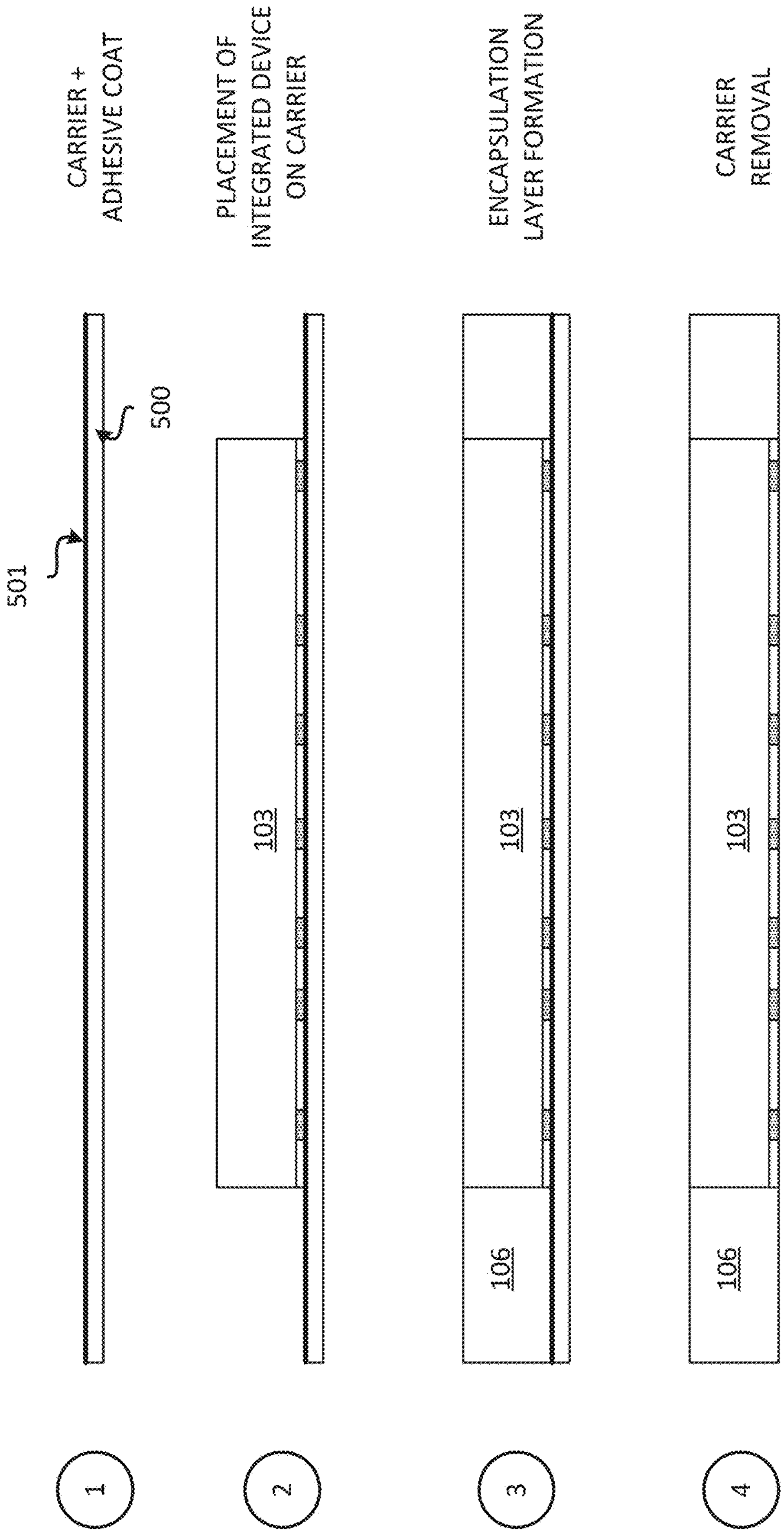
FIGS. 5A-5H illustrate an exemplary sequence for fabricating a package comprising an integrated device and a metallization portion.

Stage 1, as shown in FIG. 5A illustrates a state after a carrier 500 and an adhesive coat 501 are provided. The adhesive coat 501 may be an adhesive layer that is located over a surface of the carrier 500.

Stage 2 illustrates a state after an integrated device 103 is placed on the carrier 500 and the adhesive coat 501. A pick and place process may be used to place the integrated device. The front side of the integrated device 103 may be placed on the carrier 500 and the adhesive coat 501. In some implementations, more than one integrated device (e.g., 403, 405) may be placed on the carrier 500 and the adhesive coat 501.

Stage 3 illustrates a state after an encapsulation layer 106 is formed over the carrier 500, the adhesive coat 501 and the integrated device 103. The encapsulation layer 106 may encapsulate the integrated device 103. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process. In some implementations, once the encapsulation layer 106 is provided, portions of the encapsulation layer 106 may be removed. For example, a grinding process may be used to remove a top portion of the encapsulation layer 106 and/or a back side of the integrated device 103.

Stage 4 illustrates a state after the carrier 500 and the adhesive coat 501 are decoupled from the integrated device 103 and the encapsulation layer 106. The carrier 500 and the adhesive coat 501 may be detached from the integrated device 103 and the encapsulation layer 106.

Figure 5B:
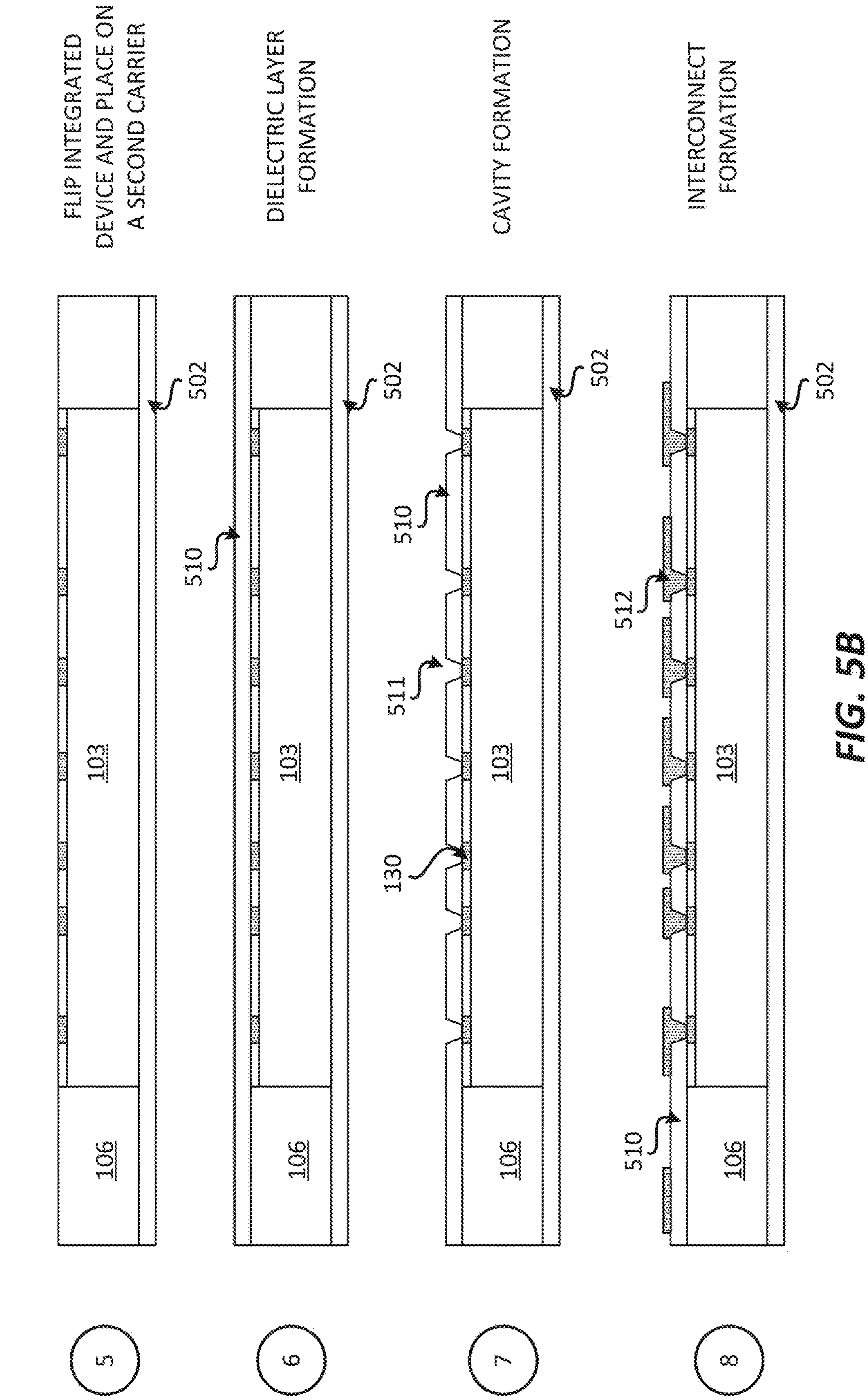

Stage 5, as shown in FIG. 5B, illustrates the integrated device 103 and the encapsulation layer 106 that are placed on a carrier 502. The back side of the integrated device 103 may be placed and coupled to the carrier 502. There may be an adhesive coat on the carrier 502, that is similar to the adhesive coat 501. A pick and place process may be used to place the integrated device 103 and the encapsulation layer 106 on the carrier 502.

Stage 6 illustrates a state after a dielectric layer 510 is formed over the integrated device 103 and the encapsulation layer 106. A deposition and/or a lamination process may be used to form the dielectric layer 510. The dielectric layer 510 may be formed over a front side of the integrated device 103.

Stage 7 illustrates a state after a plurality of cavities 511 are formed in the dielectric layer 510. The plurality of cavities 511 may be formed using an etching process (e.g., photo etching process). A masking process, an exposure process and/or a development process may be used to form the plurality of cavities 511. The plurality of cavities 511 may be formed over the plurality of die interconnects 130 of the integrated device 103, such that the plurality of die interconnects 130 are exposed (or at least part of the plurality of die interconnects 130 are exposed).

Stage 8 illustrates a state after metallization interconnects are formed in and over surfaces of the dielectric layer 510 and in the plurality of cavities 511. A plurality of metallization interconnects 512 may be formed over (e.g., above) a first surface of the dielectric layer 510 and the plurality of cavities 511. A masking process, a plating process, an exposure process, a development process and/or an etching process may be used to form the plurality of metallization interconnects 512.

Figure 5C:
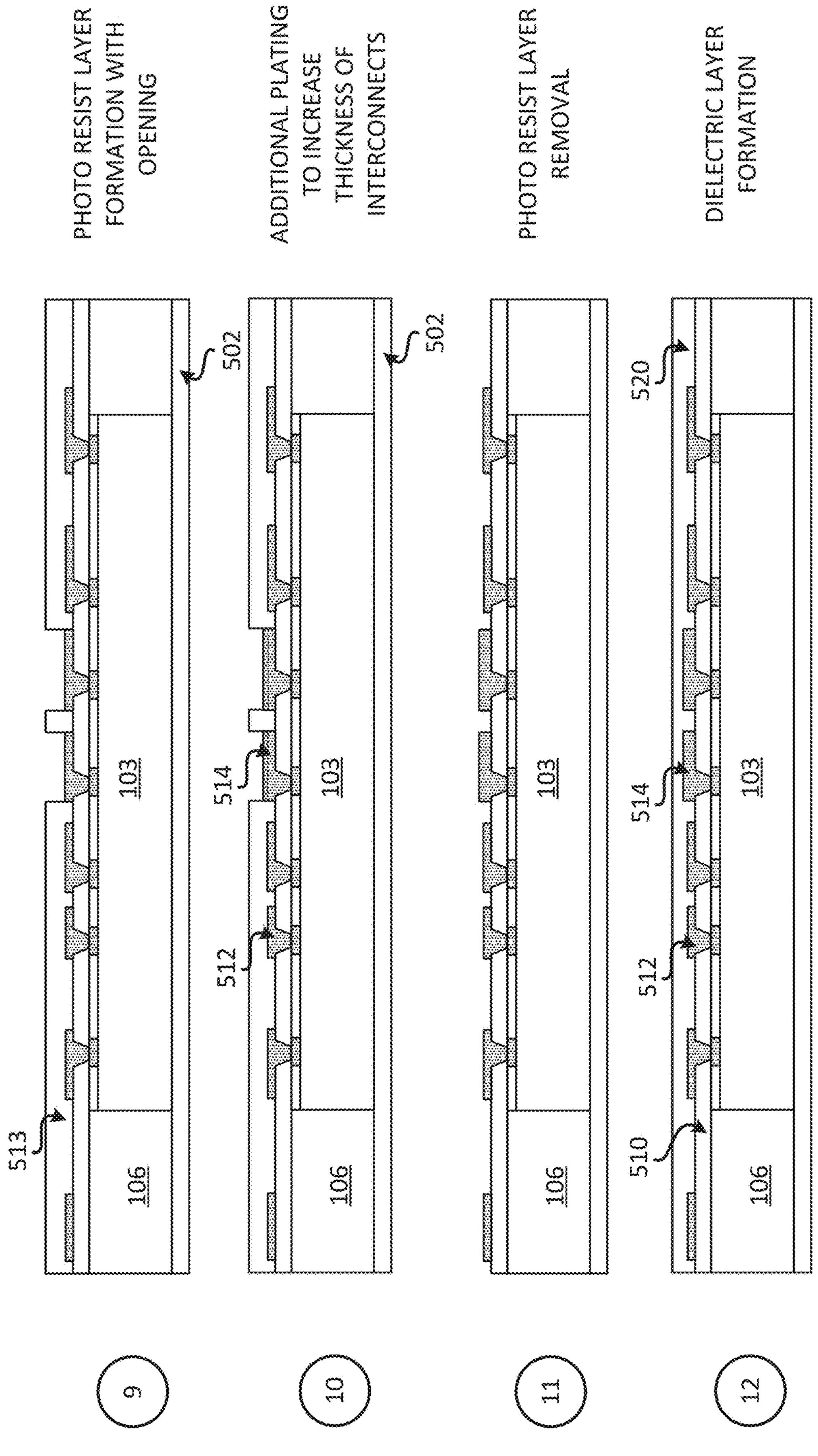
Figure 5D:
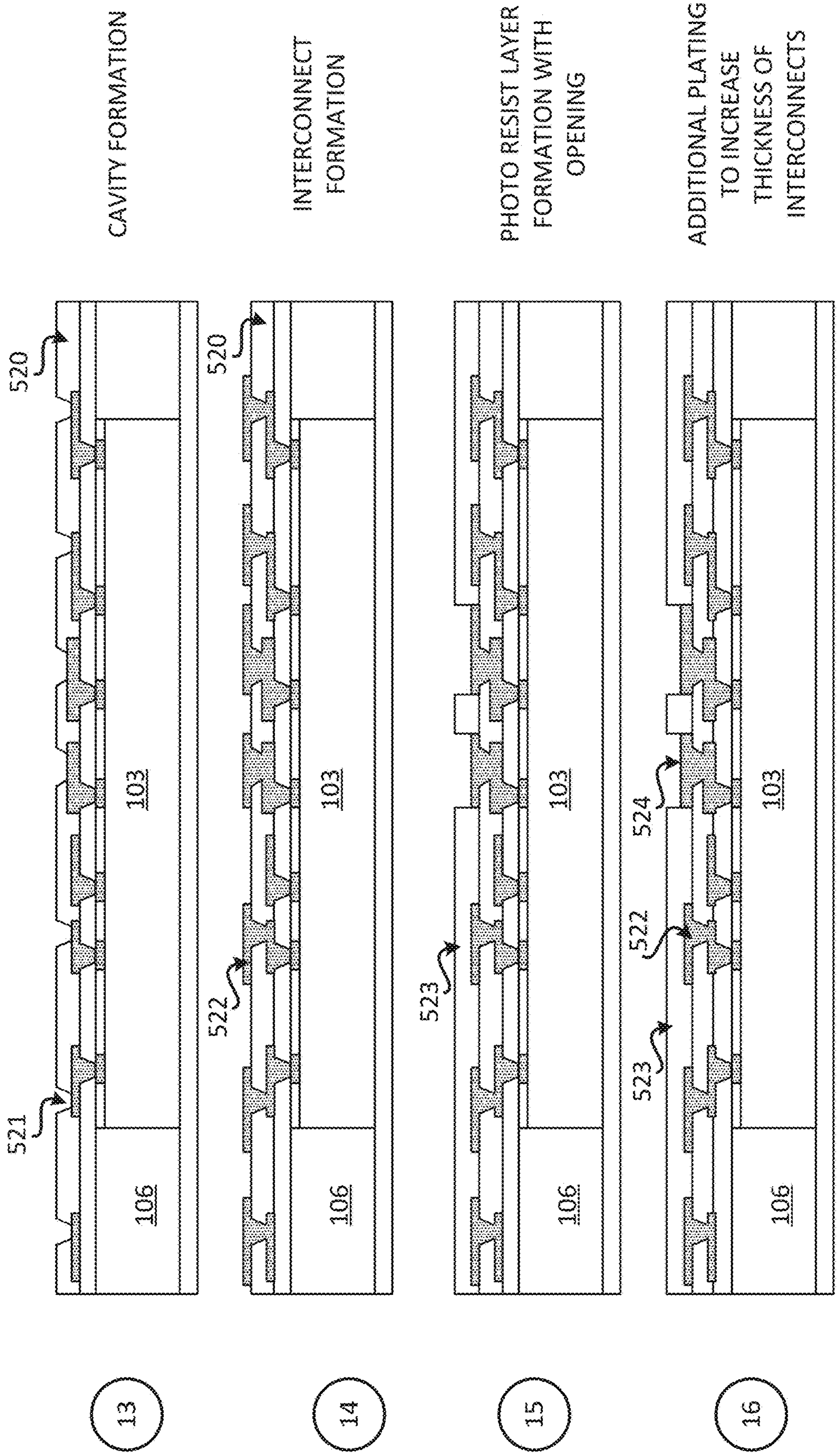

Stage 9, as shown in FIG. 5C, illustrates a state after a photo resist layer 513 is formed over the dielectric layer 510. A deposition and/or lamination process may be used to form the photo resist layer 513. The photo resist layer 513 may include openings over some metallization interconnects from the plurality of metallization interconnects 512.

Stage 10 illustrates a state after some metallization interconnects from the plurality of metallization interconnects 512 are thickened to form a plurality of metallization interconnects 514. A masking process, a plating process, an exposure process, a development process and/or an etching process may be used to form the plurality of metallization interconnects 514. As a result, some metallization interconnects on the same metal layer may have different thicknesses.

Stage 11 illustrates a state after the photo resist layer 513 is removed. An etching process may be used to remove the photo resist layer 513.

Stage 12 illustrates a state after a dielectric layer 520 is formed over the dielectric layer 510, the plurality of metallization interconnects 512 and the plurality of metallization interconnects 514. A deposition and/or a lamination process may be used to form the dielectric layer 520. The dielectric layer 520 may be similar to the dielectric layer 510.

Stage 13 illustrates a state after a plurality of cavities 521 are formed in the dielectric layer 520. The plurality of cavities 521 may be formed using an etching process (e.g., photo etching process). A masking process, an exposure process and/or a development process may be used to form the plurality of cavities 521.

Stage 14 illustrates a state after metallization interconnects are formed in and over surfaces of the dielectric layer 520 and in the plurality of cavities 521. A plurality of metallization interconnects 522 may be formed over (e.g., above) a first surface of the dielectric layer 520 and the plurality of cavities 521. A masking process, a plating process, an exposure process, a development process and/or an etching process may be used to form the plurality of metallization interconnects 522.

Stage 15 illustrates a state after a photo resist layer 523 is formed over the dielectric layer 520. A deposition and/or lamination process may be used to form the photo resist layer 523. The photo resist layer 523 may include openings over some metallization interconnects from the plurality of metallization interconnects 522.

Stage 16 illustrates a state after some metallization interconnects from the plurality of metallization interconnects 522 are thickened to form a plurality of metallization interconnects 524. A masking process, a plating process, an exposure process, a development process and/or an etching process may be used to form the plurality of metallization interconnects 524. As a result, some metallization interconnects on the same metal layer may have different thicknesses.

Figure 5E:
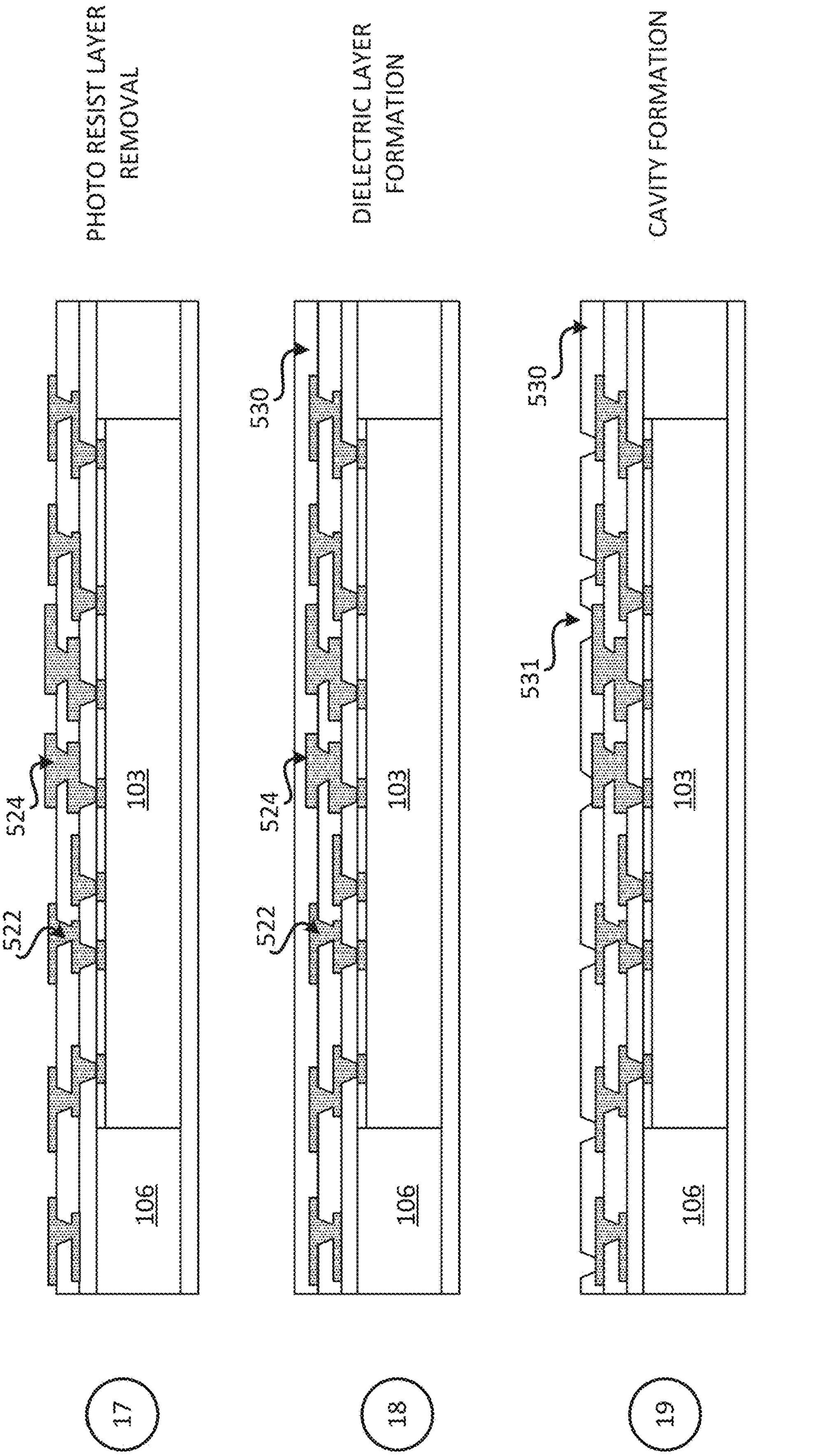

Stage 17, as shown in FIG. 5E, illustrates a state after the photo resist layer 523 is removed. An etching process may be used to remove the photo resist layer 523.

Stage 18 illustrates a state after a dielectric layer 530 is formed over the dielectric layer 520, the plurality of metallization interconnects 522 and the plurality of metallization interconnects 524. A deposition and/or a lamination process may be used to form the dielectric layer 530. The dielectric layer 530 may be similar to the dielectric layer 520.

Stage 19 illustrates a state after a plurality of cavities 531 are formed in the dielectric layer 530. The plurality of cavities 531 may be formed using an etching process (e.g., photo etching process). A masking process, an exposure process and/or a development process may be used to form the plurality of cavities 531.

Figure 5F:
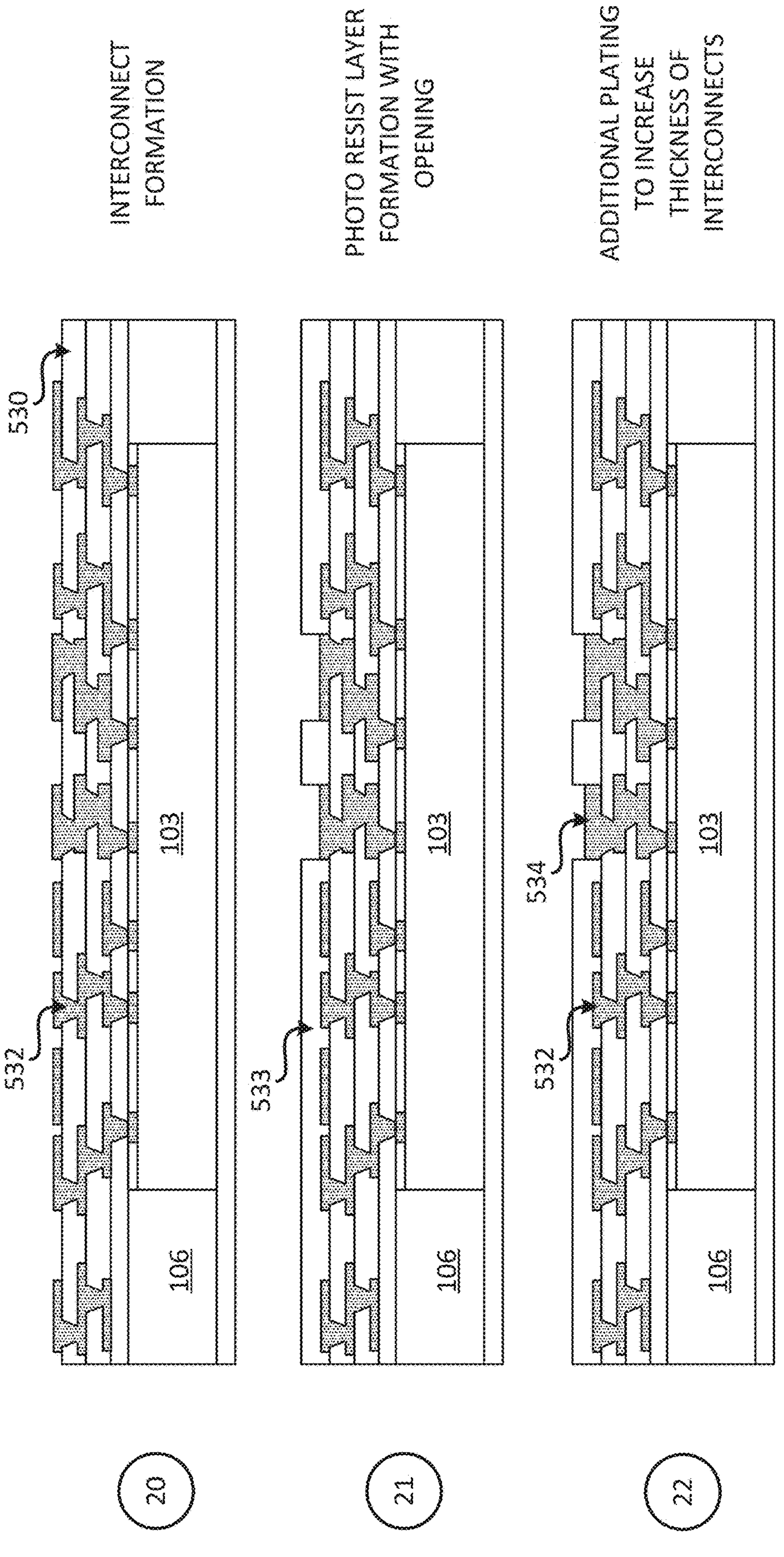

Stage 20, as shown in FIG. 5F, illustrates a state after metallization interconnects are formed in and over surfaces of the dielectric layer 530 and in the plurality of cavities 531. A plurality of metallization interconnects 532 may be formed over (e.g., above) a first surface of the dielectric layer 530 and the plurality of cavities 531. A masking process, a plating process, an exposure process, a development process and/or an etching process may be used to form the plurality of metallization interconnects 532.

Stage 21 illustrates a state after a photo resist layer 533 is formed over the dielectric layer 530. A deposition and/or lamination process may be used to form the photo resist layer 533. The photo resist layer 533 may include openings over some metallization interconnects from the plurality of metallization interconnects 532.

Stage 22 illustrates a state after some metallization interconnects from the plurality of metallization interconnects 532 are thickened to form a plurality of metallization interconnects 534. A masking process, a plating process, an exposure process, a development process and/or an etching process may be used to form the plurality of metallization interconnects 534. As a result, some metallization interconnects on the same metal layer may have different thicknesses.

Figure 5G:
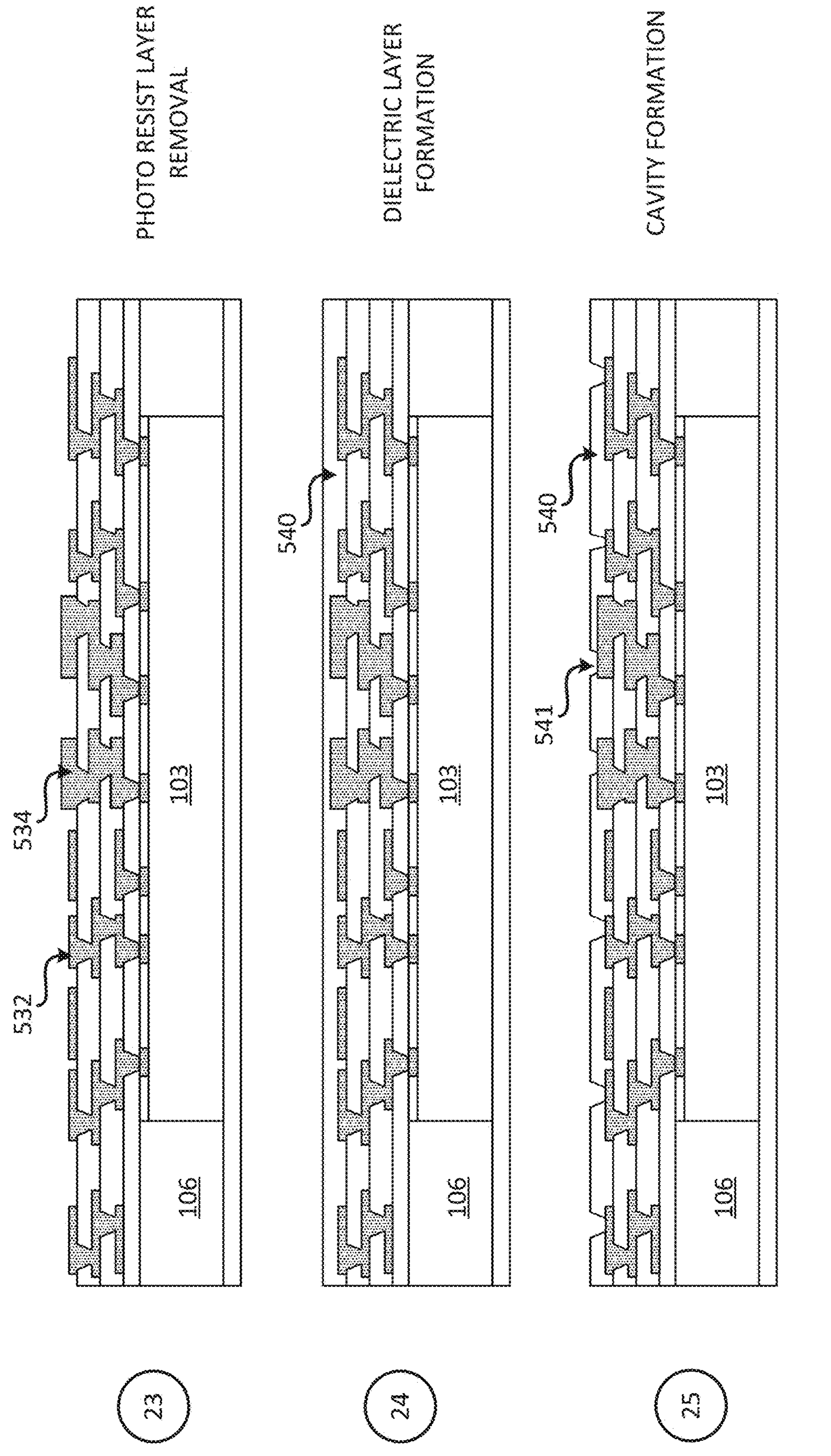

Stage 23, as shown in FIG. 5G, illustrates a state after the photo resist layer 533 is removed. An etching process may be used to remove the photo resist layer 533.

Stage 24 illustrates a state after a dielectric layer 540 is formed over the dielectric layer 530, the plurality of metallization interconnects 532 and the plurality of metallization interconnects 534. A deposition and/or a lamination process may be used to form the dielectric layer 540. The dielectric layer 540 may be similar to the dielectric layer 530.

Stage 25 illustrates a state after a plurality of cavities 541 are formed in the dielectric layer 540. The plurality of cavities 541 may be formed using an etching process (e.g., photo etching process). A masking process, an exposure process and/or a development process may be used to form the plurality of cavities 541.

Figure 5H:
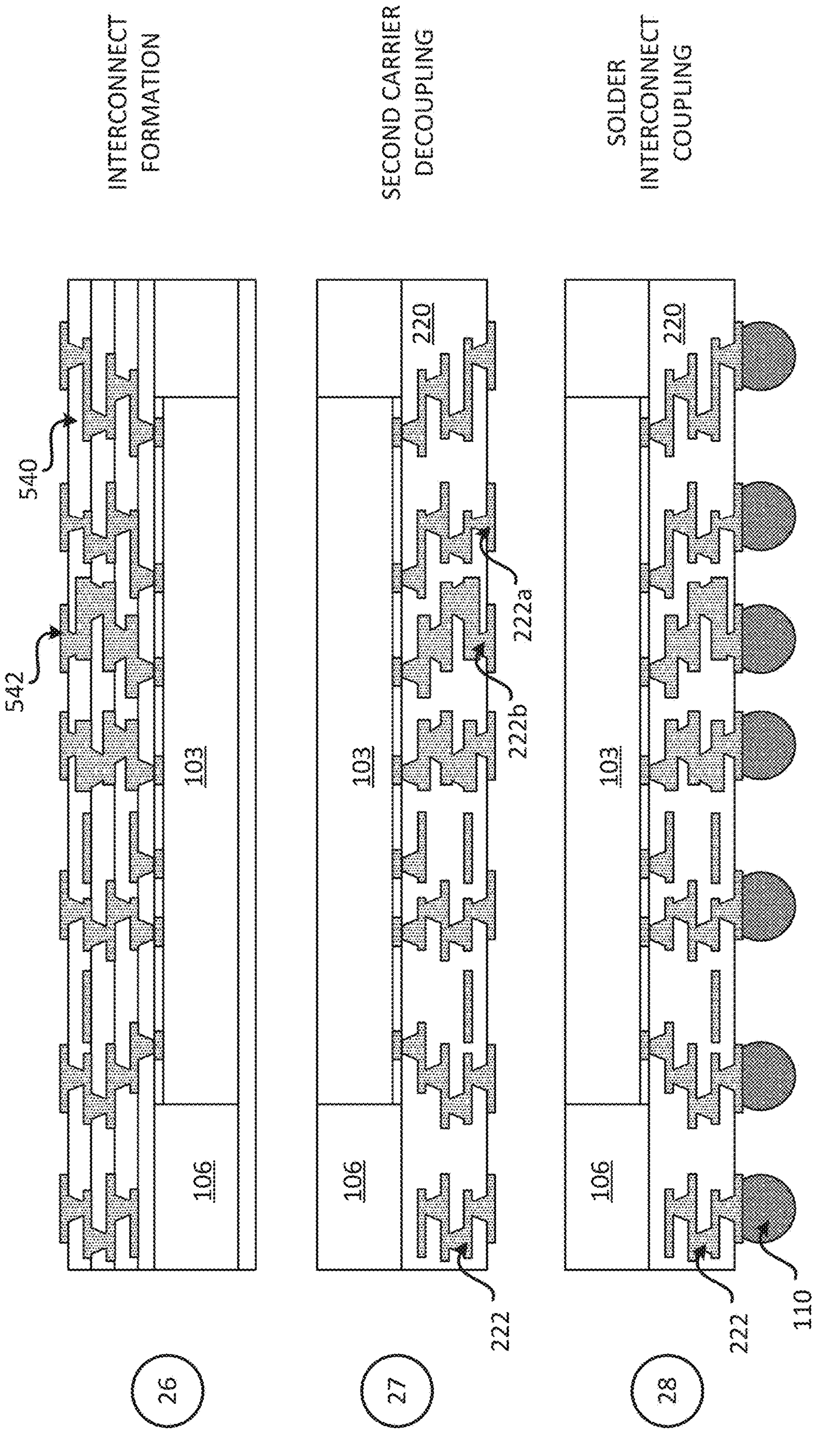

Stage 26, as shown in FIG. 5H, illustrates a state after metallization interconnects are formed in and over surfaces of the dielectric layer 540 and in the plurality of cavities 541. A plurality of metallization interconnects 542 may be formed over (e.g., above) a first surface of the dielectric layer 540 and the plurality of cavities 541. A masking process, a plating process, an exposure process, a development process and/or an etching process may be used to form the plurality of metallization interconnects 542.

Stage 27 illustrates a state after the carrier 502 is decoupled from the integrated device 103 and the encapsulation layer 106. The carrier 502 may be detached from the integrated device 103 and the encapsulation layer 106. The at least one dielectric layer 220 may represent the dielectric layer 510, the dielectric layer 520, the dielectric layer 530 and/or the dielectric layer 540. The plurality of metallization interconnects 222 may represent the plurality of metallization interconnects 512, the plurality of metallization interconnects 514, the plurality of metallization interconnects 522, the plurality of metallization interconnects 524, the plurality of metallization interconnects 532, the plurality of metallization interconnects 534, the plurality of metallization interconnects 542 and/or the plurality of metallization interconnects 544. The plurality of metallization interconnects 222 may include a first plurality of metallization interconnects 222*a* and a second plurality of metallization interconnects 222*b*, as described in at least FIGS. 2 and 3 of the disclosure.

Stage 28 illustrates a state after a plurality of solder interconnects 110 are coupled to the metallization portion 202. A solder reflow process may be used to couple the plurality of solder interconnects 110 to the plurality of metallization interconnects 222 of the metallization portion 202.

Figure 6:
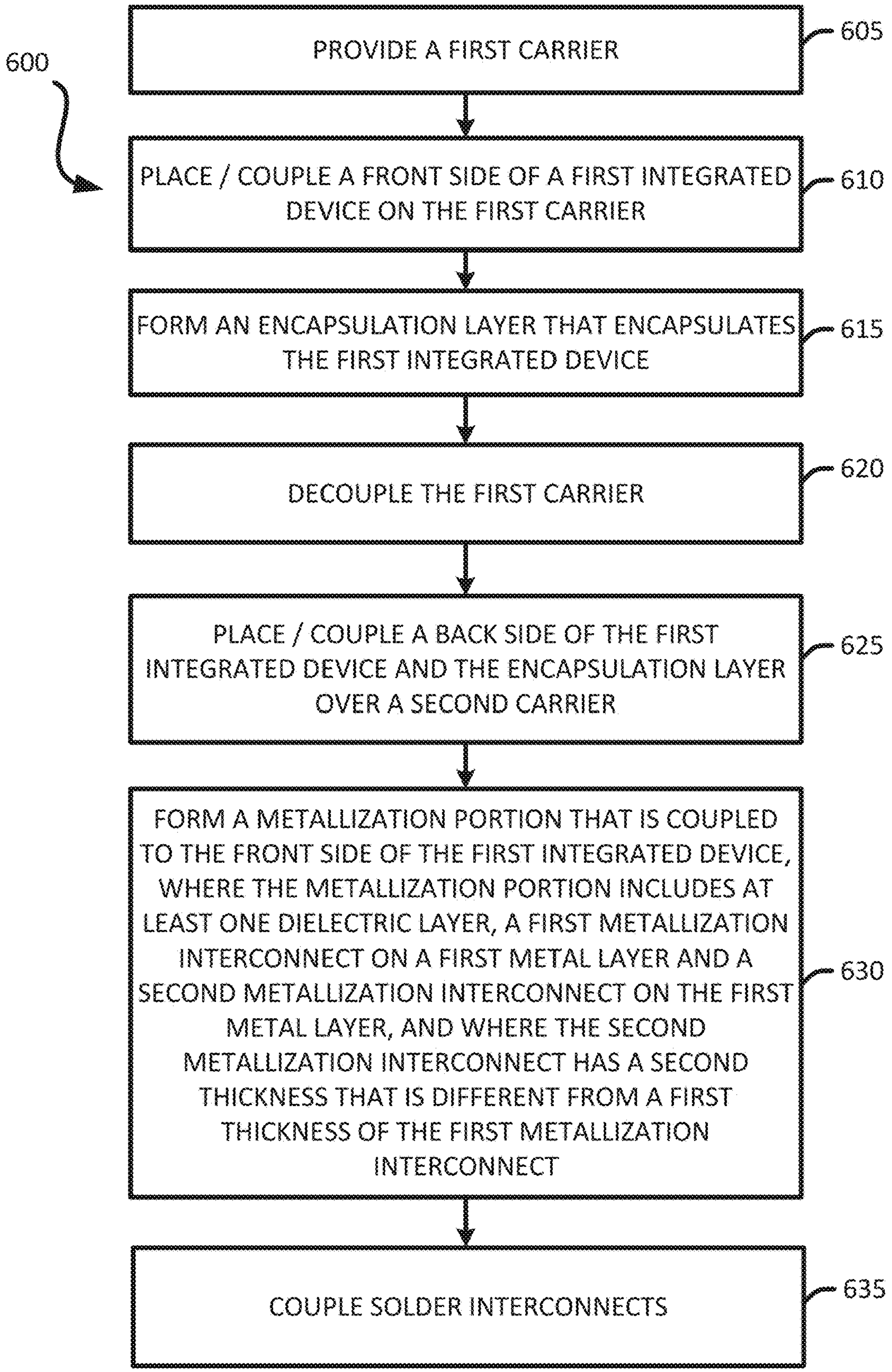
FIG. 6 illustrates an exemplary flow diagram of a method for fabricating a package comprising an integrated device and a metallization portion.

Exemplary Flow Diagram of a Method for Fabricating a Package Comprising an Integrated Device and a Metallization Portion In some implementations, fabricating a package includes several processes. FIG. 6 illustrates an exemplary flow diagram of a method 600 for providing or fabricating a package. In some implementations, the method 600 of FIG. 6 may be used to provide or fabricate any of the packages of the disclosure. For example, the method 600 of FIG. 6 may be used to fabricate the package 200.

It should be noted that the method 600 of FIG. 13 may combine one or more processes in order to simplify and/or clarify the method for providing or fabricating a package. In some implementations, the order of the processes may be changed or modified. In some implementations, one or more of processes may be replaced or substituted without departing from the scope of the disclosure. The method 600 of FIG. 6 may be used to fabricate one package or several packages at a time (as part of a wafer).

The method provides (at 605) a carrier. In some implementations, the carrier may be provided with an adhesive.

Stage 1 of FIG. 5A, illustrates and describes an example of providing a carrier 500 and an adhesive coat 501. The adhesive coat 501 may be an adhesive layer that is located over a surface of the carrier 500.

The method places (at 610) a front side of an integrated device over the carrier. In some implementations, the front side of the integrated device is placed over a carrier that includes and adhesive. In some implementations, more than one integrated device may be placed over the carrier. Stage 2 of FIG. 5A, illustrates and describes an example of an integrated device 103 that is placed on the carrier 500 and the adhesive coat 501. A pick and place process may be used to place the integrated device. The front side of the integrated device 103 may be placed on the carrier 500 and the adhesive coat 501. In some implementations, more than one integrated device (e.g., 403, 405) may be placed on the carrier 500 and the adhesive coat 501.

The method forms (at 615) an encapsulation layer that encapsulates the integrated device. The encapsulation layer may be coupled to the integrated device and the carrier. Stage 3 of FIG. 5A, illustrates and describes an example of an encapsulation layer 106 that is formed over the carrier 500, the adhesive coat 501 and the integrated device 103. The encapsulation layer 106 may encapsulate the integrated device 103. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process. In some implementations, once the encapsulation layer 106 is provided, portions of the encapsulation layer 106 may be removed. For example, a grinding process may be used to remove a top portion of the encapsulation layer 106 and/or a back side of the integrated device 103.

The method decouples (at 620) the carrier from the encapsulation layer and the integrated device. Stage 4 of FIG. 5A, illustrates and describes an example of the carrier 500 and the adhesive coat 501 that are decoupled from the integrated device 103 and the encapsulation layer 106. The carrier 500 and the adhesive coat 501 may be detached from the integrated device 103 and the encapsulation layer 106.

The method places (at 625) a back side of the integrated device and the encapsulation layer over another carrier (e.g., second carrier). The carrier may include an adhesive. Stage 5 of FIG. 5B, illustrates and describes an example of the integrated device 103 and the encapsulation layer 106 that are placed on a carrier 502. The back side of the integrated device 103 may be placed and coupled to the carrier 502. There may be an adhesive coat on the carrier 502, that is similar to the adhesive coat 501. A pick and place process may be used to place the integrated device 103 and the encapsulation layer 106 on the carrier 502.

The method forms (at 630) a metallization portion that is coupled to the front side of the integrated device and the encapsulation layer. The metallization portion may include at least one dielectric layer and a plurality of metallization interconnects. The plurality of metallization interconnects may include a first metallization interconnect on a first metal layer and a second metallization interconnect on a first metal layer, where the second interconnect has a second thickness that is different from a first thickness of the first metallization interconnect. Forming the metallization portion may include forming at least one dielectric layer and forming a first metallization interconnect on a first metal layer and a second metallization interconnect on a first metal layer. The second interconnect may have a second thickness that is different from a first thickness of the first metallization interconnect. Stage 6 of FIG. 5B through Stage 26 of FIG. 5H illustrate examples of forming a metallization portion that is coupled to at least one integrated device. Different implementations may have different numbers of metal layers. Once the metallization portion is formed (at 630), the method may decouple the second carrier from the integrated device and the encapsulation layer. Stage 27 of FIG. 5H, illustrates an example of decoupling a second carrier.

The method couples (at 635) a plurality of solder interconnects to the metallization interconnects of the metallization portion. Stage 28 of FIG. 5H, illustrates and describes an examples of a plurality of solder interconnects 110 that are coupled to the metallization portion 202. A solder reflow process may be used to couple the plurality of solder interconnects 110 to the plurality of metallization interconnects 222 of the metallization portion 202.

Figure 7:
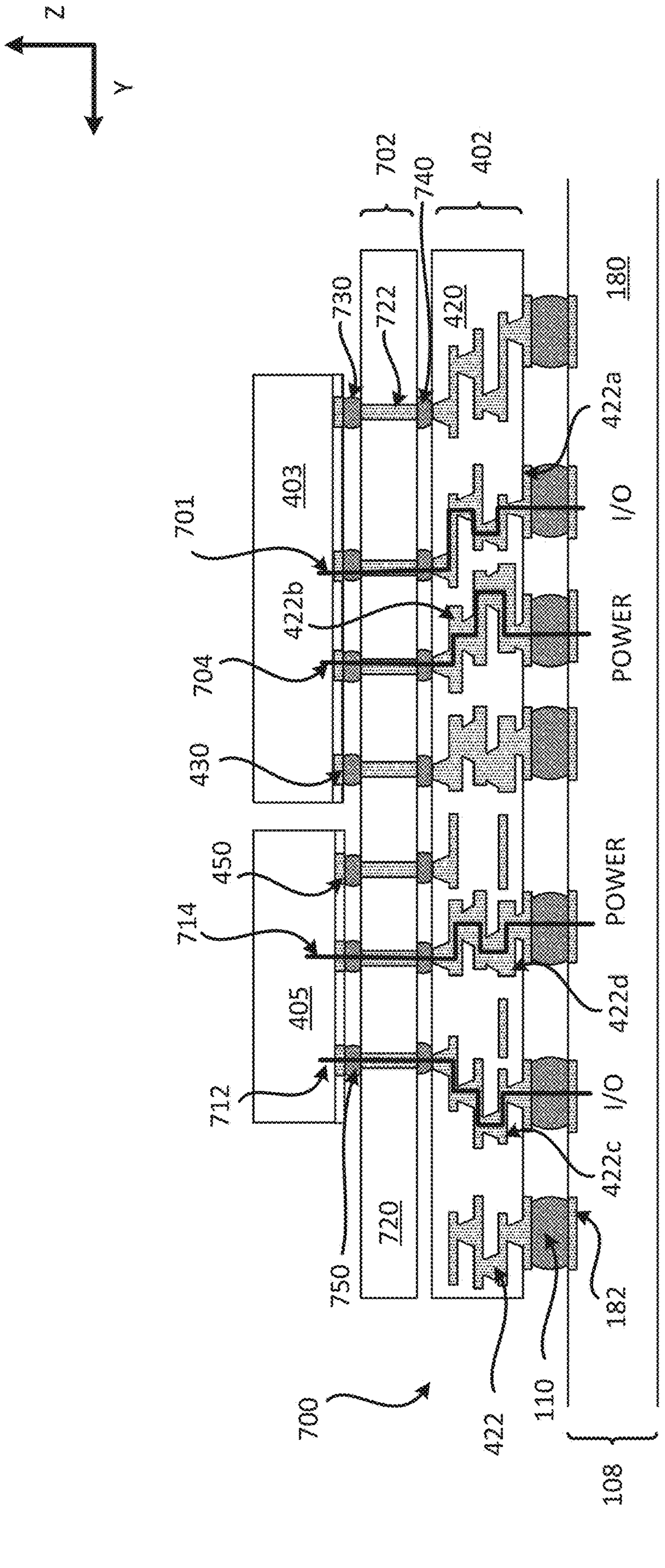
FIG. 7 illustrates a cross sectional profile view of an exemplary package comprising an integrated device, an interposer and a metallization portion.

Exemplary Package Comprising an Integrated Device, a Metallization Portion, a Bridge and/or an Interposer FIG. 7 illustrates a package that includes an interposer and a metallization portion with metallization interconnects with different thicknesses. The package 700 includes a metallization portion 402, an interposer 702, an integrated device 403, and an integrated device 405. The integrated device 403 is coupled to a first surface of the interposer 702 through a plurality of solder interconnects 730. The integrated device 405 is coupled to the first surface of the interposer 702 through a plurality of solder interconnects 750. The interposer 702 may be a type of a substrate. The interposer 702 includes at least one dielectric layer 720 (e.g., substrate dielectric layer, interposer dielectric layer) and a plurality of interposer interconnects 722 (e.g., substrate interconnects). The interposer 702 may include a silicon. For example, the at least one dielectric layer 720 may include silicon. The integrated device 403 may be bare die (e.g., semiconductor bare die). The integrated device 405 may be bare die (e.g., semiconductor bare die). The integrated device 403 may be a first integrated device (e.g., first chiplet), and the integrated device 405 may be a second integrated device (e.g., second chiplet). It is noted that instead of the interposer 702, a laminate substrate may be used, such as an embedded trace substrate that includes at least one dielectric layer and a plurality of substrate interconnects.

The integrated device 403 may be configured to perform a first plurality of functions and/or operations. The integrated device 405 may be configured to perform a second plurality of functions and/or operations. The second plurality of functions and/or operations include at least one function and/or operation that is different from the first plurality of functions and/or operations.

The metallization portion 402 is coupled to a second surface of the interposer 702 through a plurality of solder interconnects 740. The metallization portion 402 includes at least one dielectric layer 420 and a plurality of metallization interconnects 422. The plurality of metallization interconnects 422 may include a first plurality of metallization interconnects 422*a*, a second plurality of metallization interconnects 422*b*, a third plurality of metallization interconnects 422*c*, and a fourth plurality of metallization interconnects 422*d*.

The first plurality of metallization interconnects 422*a* may be similar to the first plurality of metallization interconnects 122*a* and/or the first plurality of metallization interconnects 222*a*. The third plurality of metallization interconnects 422*c* may be similar to the first plurality of metallization interconnects 122*a* and/or the first plurality of metallization interconnects 222*a*. The second plurality of metallization interconnects 422*b* may be similar to the second plurality of metallization interconnects 122*b* and/or the second plurality of metallization interconnects 222*b*. The fourth plurality of metallization interconnects 422*d* may be similar to the second plurality of metallization interconnects 122*b* and/or the second plurality of metallization interconnects 222*b*.

FIG. 7 illustrates exemplary electrical paths for a package, such as an electrical path 701, an electrical path 704, an electrical path 712, and an electrical path 714. An electrical path between the integrated device 403 and the board 108 may include the electrical path 701. The electrical path 701 may include a board interconnect from the plurality of board interconnects 182, a solder interconnect from the plurality of solder interconnects 110, the first plurality of metallization interconnects 422*a*, a solder interconnect from the plurality of solder interconnects 740, an interposer interconnect from the plurality of interposer interconnects 722 (e.g., a substrate interconnect from the plurality of substrate interconnects), a solder interconnect from the plurality of solder interconnects 730, and a first die interconnect from the integrated device 403. The electrical path 701 may be configured to provide an electrical path for input/output signals.

An electrical path between the integrated device 403 and the board 108 may include the electrical path 704. The electrical path 704 may include another board interconnect from the plurality of board interconnects 182, another solder interconnect from the plurality of solder interconnects 110, the second plurality of metallization interconnects 422*b*, a solder interconnect from the plurality of solder interconnects 740, an interposer interconnect from the plurality of interposer interconnects 722 (e.g., a substrate interconnect from the plurality of substrate interconnects), a solder interconnect from the plurality of solder interconnects 730, and a second die interconnect from the integrated device 403. The electrical path 704 may be configured to provide an electrical path for power or ground.

An electrical path between the integrated device 405 and the board 108 may include the electrical path 712. The electrical path 712 may include a board interconnect from the plurality of board interconnects 182, a solder interconnect from the plurality of solder interconnects 110, the third plurality of metallization interconnects 422*c*, a solder interconnect from the plurality of solder interconnects 740, an interposer interconnect from the plurality of interposer interconnects 722 (e.g., a substrate interconnect from the plurality of substrate interconnects), a solder interconnect from the plurality of solder interconnects 750, and a first die interconnect from the integrated device 405. The electrical path 712 may be configured to provide an electrical path for input/output signals.

An electrical path between the integrated device 405 and the board 108 may include the electrical path 714. The electrical path 714 may include another board interconnect from the plurality of board interconnects 182, another solder interconnect from the plurality of solder interconnects 110, the fourth plurality of metallization interconnects 422*d*, a solder interconnect from the plurality of solder interconnects 740, an interposer interconnect from the plurality of interposer interconnects 722 (e.g., a substrate interconnect from the plurality of substrate interconnects), a solder interconnect from the plurality of solder interconnects 750, and a second die interconnect from the integrated device 405. The electrical path 714 may be configured to provide an electrical path for power or ground.

An electrical path between the integrated device 405 and the integrated device 403 may include a die interconnect from the integrated device 405, at least one interposer interconnect from the plurality of interposer interconnects 722 and a die interconnect from the integrated device 403.

In some implementations, the package 700 may be fabricated by coupling the integrated device 403 and the integrated device 405 to the interposer 702 through a plurality of solder interconnects (e.g., 730, 750). A method may then couple the interposer 702 to the metallization portion 402 through a plurality of solder interconnects 740. A method may then couple the metallization portion 402 to the board 108 through a plurality of solder interconnects 110. However, different implementations may use a different sequence to fabricate the package 700. The interposer 702 may be used when there is a meaningful difference between the size and/or pitch of the pad interconnects of the integrated device (e.g., 403, 405) and the interconnects of the metallization portion 402.

Figure 8:
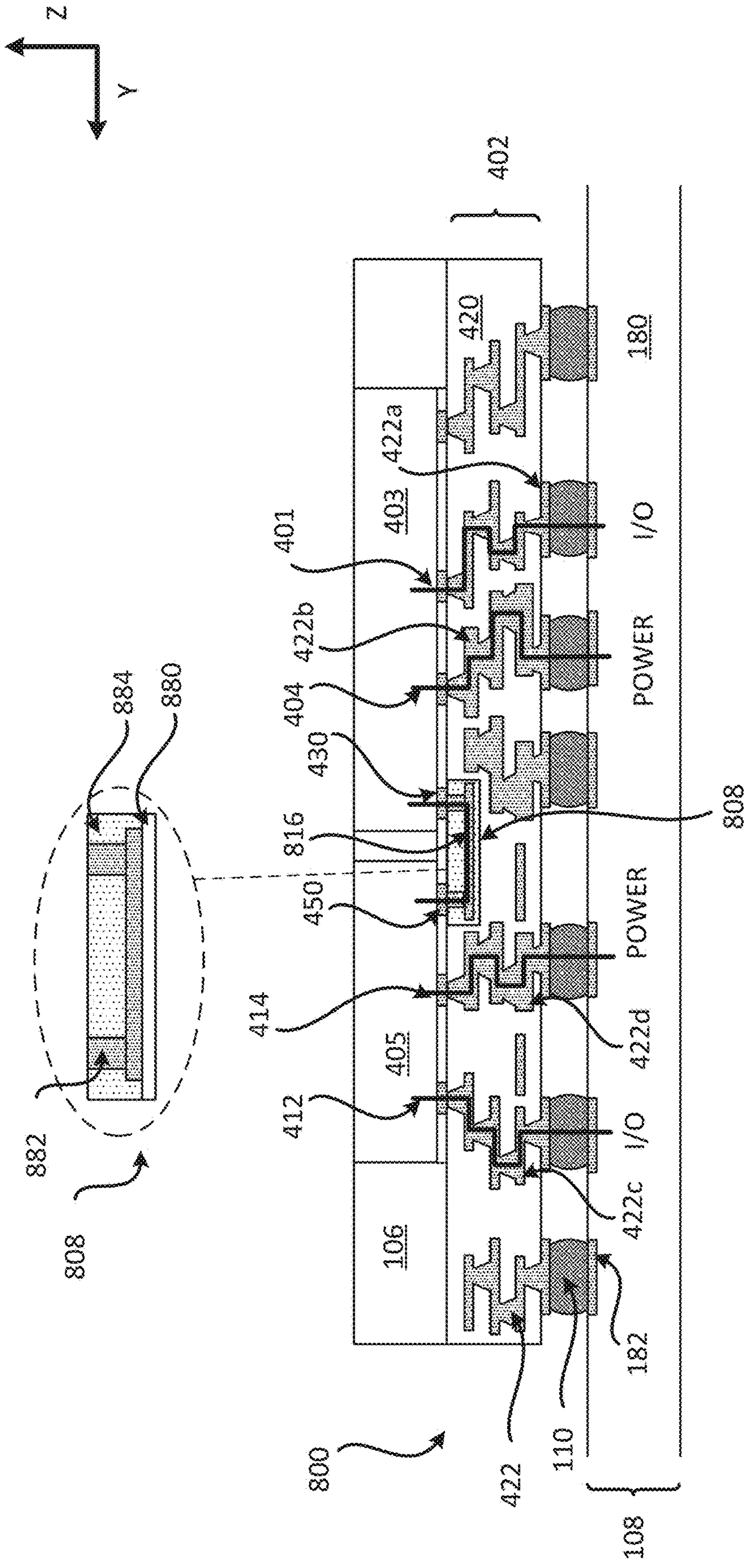
FIG. 8 illustrates a cross sectional profile view of an exemplary package comprising a first integrated device, a second integrated device, a bridge and a metallization portion.

FIG. 8 illustrates a package that includes a bridge and a metallization portion with metallization interconnects with different thicknesses. The package 800 includes a metallization portion 402, an integrated device 403, an integrated device 405 and a bridge 808. The bridge 808 may include a silicon based bridge. The package 800 is similar to the package 400 of FIG. 4.

The integrated device 403 is coupled to a first surface of the metallization portion 402. The integrated device 405 is coupled to the first surface of the metallization portion 402. The integrated device 403 may be bare die (e.g., semiconductor bare die). The integrated device 405 may be bare die (e.g., semiconductor bare die). The integrated device 403 may be a first integrated device (e.g., first chiplet), and the integrated device 405 may be a second integrated device (e.g., second chiplet). The integrated device 403 and the integrated device 405 are coupled to and touching the metallization portion 402. The front side of the integrated device 403 may face the metallization portion 402. The front side of the integrated device 405 may face the metallization portion 402. The encapsulation layer 106 may encapsulate the integrated device 403 and the integrated device 405. The encapsulation layer 106 may be coupled to the first surface of the metallization portion 402. The integrated device 403 may be configured to perform a first plurality of functions and/or operations. The integrated device 405 may be configured to perform a second plurality of functions and/or operations. The second plurality of functions and/or operations includes at least one function and/or operation that is different from the first plurality of functions and/or operations.

The bridge 808 is located at least partially in the metallization portion 402. The bridge 808 is coupled to the integrated device 403 and the integrated device 405. The bridge 808 may be coupled to the integrated device 403 and/or the integrated device 405 through hybrid bonding (e.g., copper to copper bonding, interconnect to interconnect bonding). In some implementations, the bridge 808 may be coupled to the integrated device 403 and/or the integrated device 405 through at least a plurality of solder interconnects (not shown). The front side of the integrated device 403 and the front side of the integrated device 405 may face the bridge 808. The bridge 808 may include a bridge substrate 880 and a plurality of bridge interconnects 882. The bridge 808 may include at least one dielectric layer 884. In some implementations, the bridge 808 may be a silicon based bridge. The bridge substrate 880 may include silicon. The plurality of bridge interconnects 882 may be coupled to the die pads (e.g., 430) of the integrated device 403 and the die pads (e.g., 450) of the integrated device 405. FIG. 8 illustrates an electrical path 816 between the integrated device 403 and the integrated device 405. The electrical path 816 may be configured to provide at least one electrical path for input/output signals between the integrated device 403 and the integrated device 405.

The electrical path 816 includes a die interconnect from the integrated device 403, at least one bridge interconnect from the plurality of bridge interconnects 882 of the bridge 808 and a die interconnect from the integrated device 405.

The metallization portion 402 includes at least one dielectric layer 420 and a plurality of metallization interconnects 422. The bridge 808 may be located at least partially in the metallization portion 402. The plurality of metallization interconnects 422 may include a first plurality of metallization interconnects 422*a*, a second plurality of metallization interconnects 422*b*, a third plurality of metallization interconnects 422*c*, and a fourth plurality of metallization interconnects 422*d*.

The first plurality of metallization interconnects 422*a* may be similar to the first plurality of metallization interconnects 122*a* and/or the first plurality of metallization interconnects 222*a*. The third plurality of metallization interconnects 422*c* may be similar to the first plurality of metallization interconnects 122*a* and/or the first plurality of metallization interconnects 222*a*. The second plurality of metallization interconnects 422*b* may be similar to the second plurality of metallization interconnects 122*b* and/or the second plurality of metallization interconnects 222*b*. The fourth plurality of metallization interconnects 422*d* may be similar to the second plurality of metallization interconnects 122*b* and/or the second plurality of metallization interconnects 222*b*.

FIG. 8 illustrates exemplary electrical paths for a package, such as an electrical path 401, an electrical path 404, an electrical path 412 and an electrical path 414. An electrical path between the integrated device 403 and the board 108 may include the electrical path 401. The electrical path 401 may include a board interconnect from the plurality of board interconnects 182, a solder interconnect from the plurality of solder interconnects 110, the first plurality of metallization interconnects 422*a*, and a first die interconnect from the integrated device 403. The electrical path 401 may be configured to provide an electrical path for input/output signals.

An electrical path between the integrated device 403 and the board 108 may include the electrical path 404. The electrical path 404 may include another board interconnect from the plurality of board interconnects 182, another solder interconnect from the plurality of solder interconnects 110, the second plurality of metallization interconnects 422*b*, and a second die interconnect from the integrated device 403. The electrical path 404 may be configured to provide an electrical path for power or ground.

An electrical path between the integrated device 405 and the board 108 may include the electrical path 412. The electrical path 412 may include a board interconnect from the plurality of board interconnects 182, a solder interconnect from the plurality of solder interconnects 110, the third plurality of metallization interconnects 422*c*, and a first die interconnect from the integrated device 405. The electrical path 412 may be configured to provide an electrical path for input/output signals.

An electrical path between the integrated device 405 and the board 108 may include the electrical path 414. The electrical path 414 may include another board interconnect from the plurality of board interconnects 182, another solder interconnect from the plurality of solder interconnects 110, the fourth plurality of metallization interconnects 422*d*, and a second die interconnect from the integrated device 405. The electrical path 414 may be configured to provide an electrical path for power or ground.

In some implementations, an electrical path between the integrated device 405 and the integrated device 403 may include a die interconnect from the integrated device 405, at least one metallization interconnect from the plurality of metallization interconnects 422 and a die interconnect from the integrated device 403.

It is noted that different portions of the metallization portion of a package may have different minimum interconnect thickness, minimum line and space dimensions, minimum pitches. In one example, the metallization portion may have the same global sets of minimum interconnect thickness, minimum line and space dimensions, and/or minimum pitches. In another example, the metallization portion includes (i) a first set of minimum interconnect thickness, minimum line and space dimensions, and/or minimum pitches, and (ii) a second set of minimum interconnect thickness, minimum line and space dimensions, and/or minimum pitches. For example, the second set of minimum interconnect thickness, minimum line and space dimensions, and/or minimum pitches may be located in a region of metallization portion that is vertically overlapping with one or more integrated devices. Some of the minimum dimensions may be local minimum dimensions for the metallization portion. Some of these minimum dimensions may be global dimensions for the metallization portion. Thus, different portions of the metallization portion may have different minimum interconnect thickness, different minimum line and space dimensions, and/or different minimum pitches.

Figure 9A:
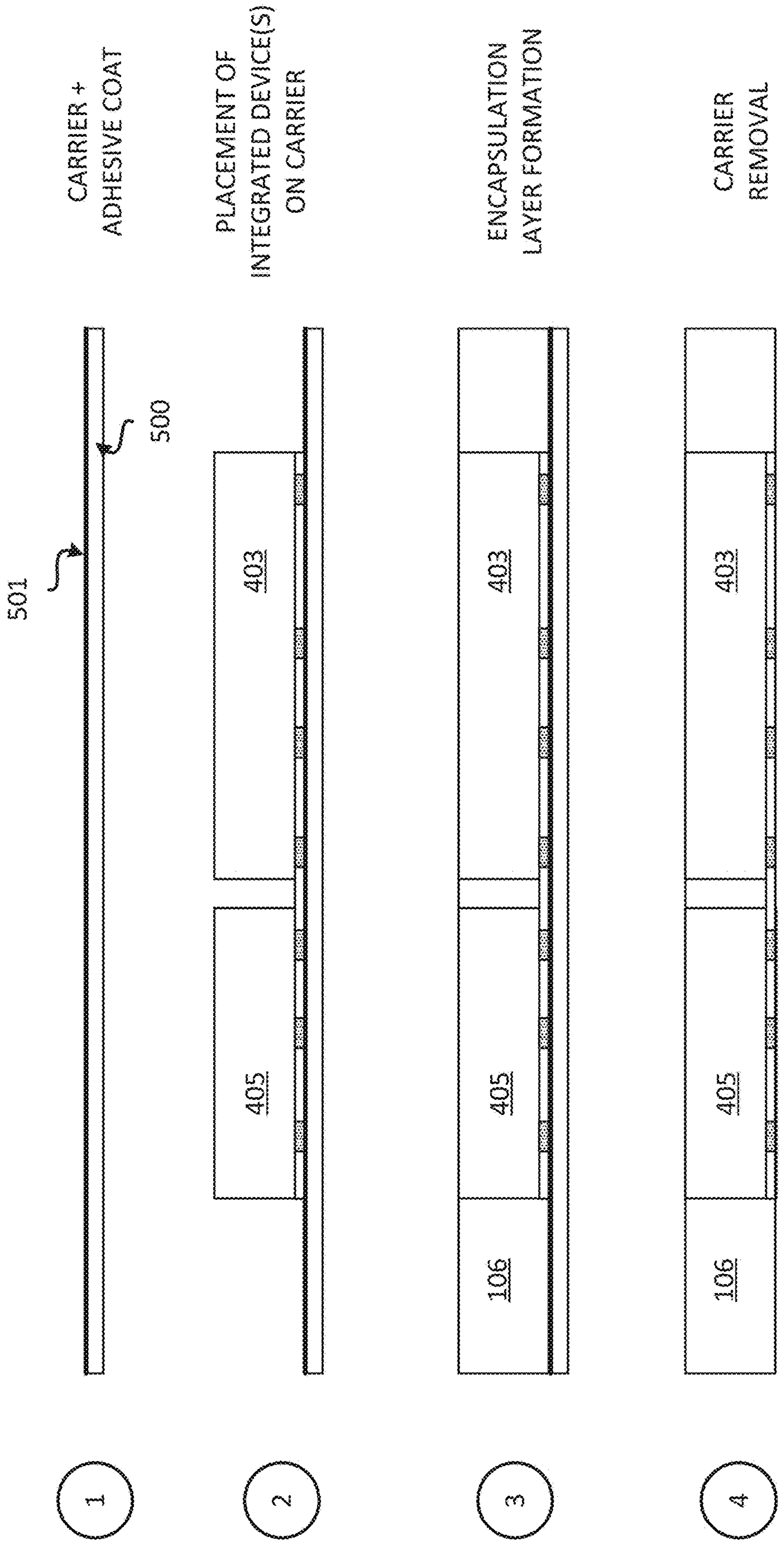
FIGS. 9A-9C illustrate an exemplary sequence for fabricating a package comprising an integrated device, a bridge and a metallization portion.
Figure 9B:
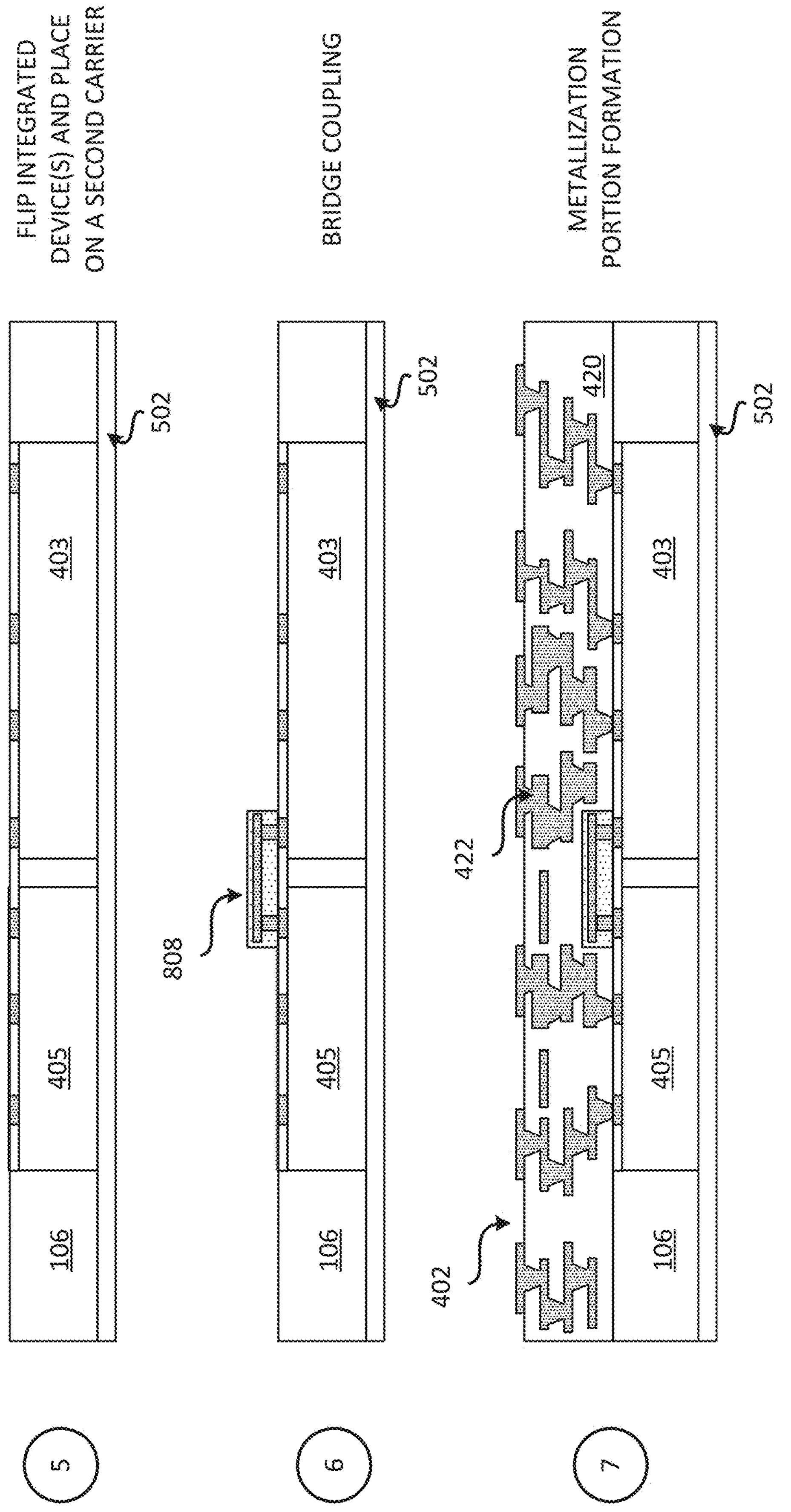
Figure 9C:
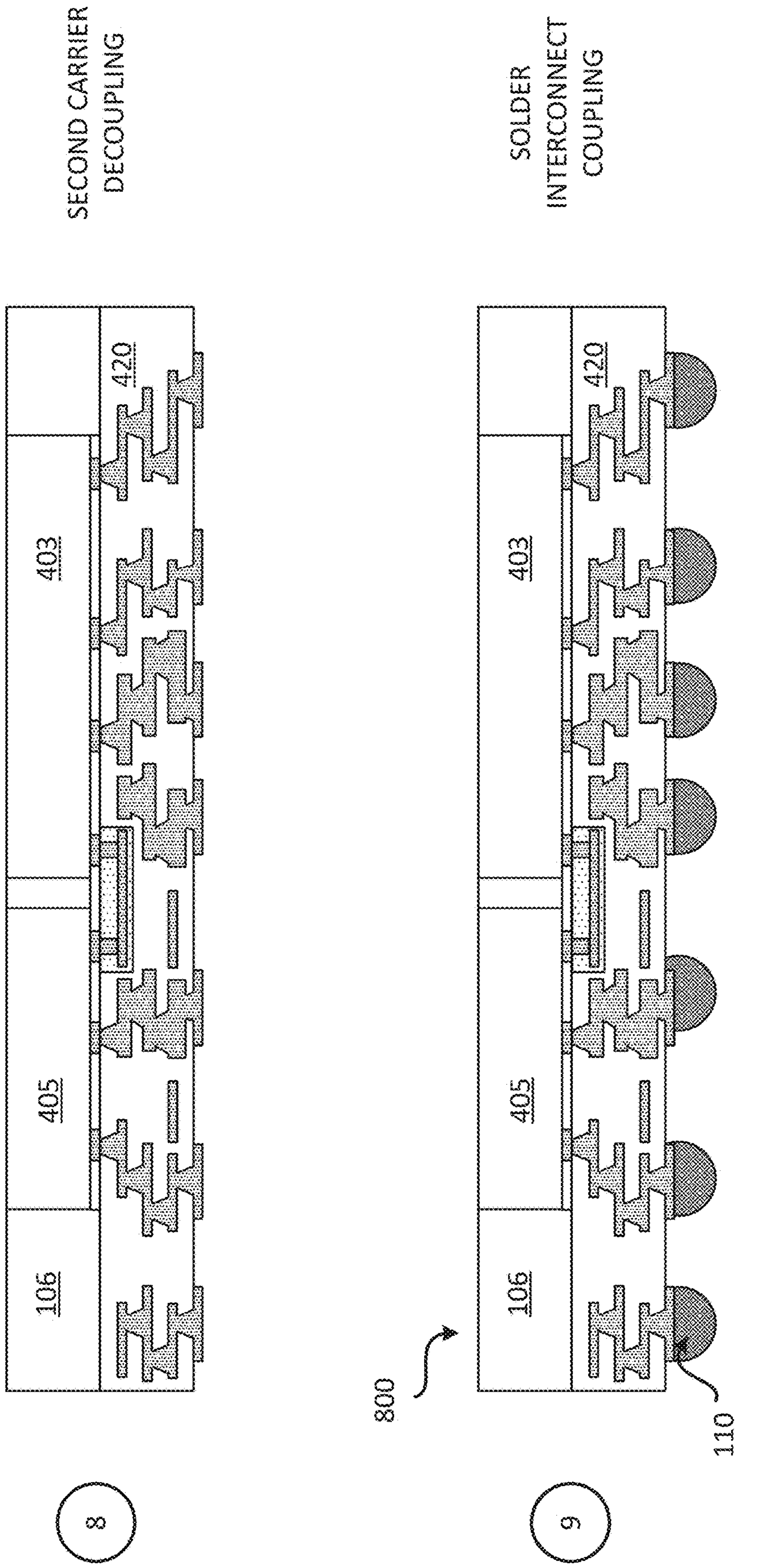

Exemplary Sequence for Fabricating a Package Comprising an Integrated Device and a Metallization Portion FIGS. 9A-9C illustrate an exemplary sequence for providing or fabricating a package that includes an integrated device and a metallization portion with metallization interconnects with different thicknesses. In some implementations, the sequence of FIGS. 9A-9C may be used to provide or fabricate the package 800 of FIG. 8, or any of the packages described in the disclosure.

It should be noted that the sequence of FIGS. 9A-9C may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 9A-9C may be used to fabricate one package or several packages at a time (as part of a wafer).

Stage 1, as shown in FIG. 9A illustrates a state after a carrier 500 and an adhesive coat 501 are provided. The adhesive coat 501 may be an adhesive layer that is located over a surface of the carrier 500.

Stage 2 illustrates a state after an integrated device 403 and an integrated device 405 are placed on the carrier 500 and the adhesive coat 501. A pick and place process may be used to place the integrated device. The front side of the integrated device 403 and the front side of the integrated device 405 may be placed on the carrier 500 and the adhesive coat 501.

Stage 3 illustrates a state after an encapsulation layer 106 is formed over the carrier 500, the adhesive coat 501 the integrated device 403 and the integrated device 405. The encapsulation layer 106 may encapsulate the integrated device 103. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process. In some implementations, once the encapsulation layer 106 is provided, portions of the encapsulation layer 106 may be removed. For example, a grinding process may be used to remove a top portion of the encapsulation layer 106, a back side of the integrated device 403 and/or a back side of the integrated device 405.

Stage 4 illustrates a state after the carrier 500 and the adhesive coat 501 are decoupled from the integrated device 403, the integrated device 405 and the encapsulation layer 106. The carrier 500 and the adhesive coat 501 may be detached from the integrated device 403, the integrated device 405 and the encapsulation layer 106.

Stage 5, as shown in FIG. 5B, illustrates the integrated device 403, the integrated device 405 and the encapsulation layer 106 are placed on a carrier 502. The back side of the integrated device 403 and the back side of the integrated device 405 may be placed and coupled to the carrier 502. There may be an adhesive coat on the carrier 502, that is similar to the adhesive coat 501. A pick and place process may be used to place the integrated device 403, the integrated device 405 and the encapsulation layer 106 on the carrier 502.

Stage 6 illustrates a state after the bridge 808 is coupled to the integrated device 403 and the integrated device 405. The bridge 808 may be coupled to the integrated device 403 and/or the integrated device 405 through hybrid bonding (e.g., copper to copper bonding, interconnect to interconnect bonding, metal to metal bonding) In some implementations, the bridge 808 may be coupled to the integrated device 403 and/or the integrated device 405 through at least a plurality of solder interconnects (not shown). The front side of the integrated device 403 and the front side of the integrated device 405 may face the bridge 808. The bridge 808 may include a bridge substrate 880 and a plurality of bridge interconnects 882. The bridge 808 may include at least one dielectric layer 884. In some implementations, the bridge 808 may be a silicon bridge. The bridge substrate 880 may include silicon. The plurality of bridge interconnects 882 may be coupled to the die pads (e.g., 430) of the integrated device 403 and the die pads (e.g., 450) of the integrated device 405.

Stage 7 illustrates a state after a metallization portion 402 is formed over the integrated device 403, the integrated device 405, the bridge 808 and the encapsulation layer 106. The metallization portion 402 may include at least one dielectric layer 420 and a plurality of metallization interconnects 422. The bridge 808 may be at least partially located in the metallization portion 402 and/or at least partially surrounded by the at least one dielectric layer 420 of the metallization portion 402. Stage 6 of FIG. 5B through stage 26 of FIG. 5H illustrates and describes an example of a sequence of forming a metallization portion.

Stage 8 illustrates a state after the carrier 502 is decoupled from the integrated device 403, the integrated device 405 and the encapsulation layer 106. The carrier 502 may be detached from the integrated device 403, the integrated device 405 and the encapsulation layer 106.

Stage 9 illustrates a state after a plurality of solder interconnects 110 are coupled to the metallization portion 402. A solder reflow process may be used to couple the plurality of solder interconnects 110 to the plurality of metallization interconnects 222 of the metallization portion 202.

Figure 10:
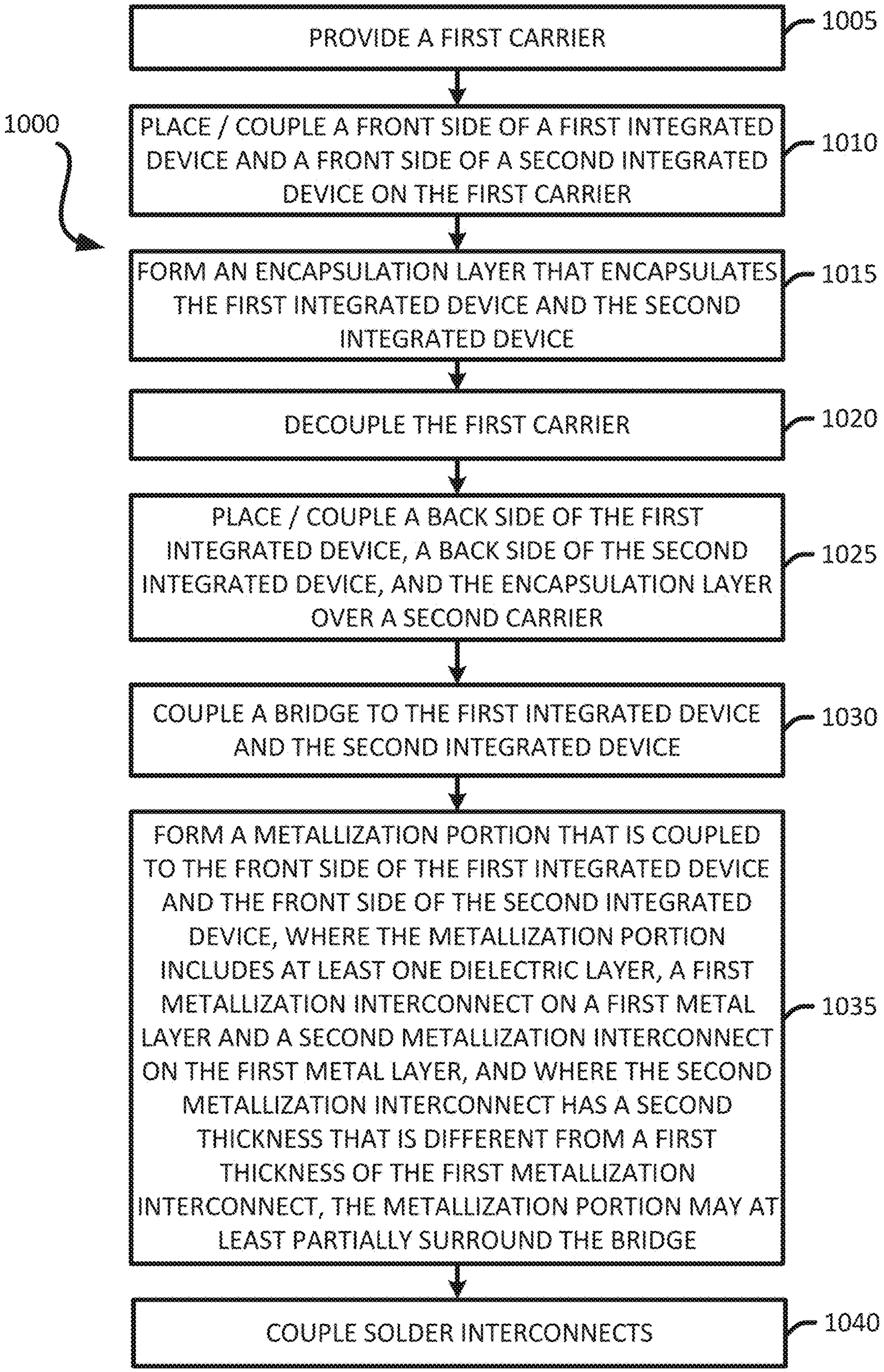
FIG. 10 illustrates an exemplary flow diagram of a method for fabricating a package comprising an integrated device, a bridge and a metallization portion.

Exemplary Flow Diagram of a Method for Fabricating a Package Comprising an Integrated Device and a Metallization Portion In some implementations, fabricating a package includes several processes. FIG. 10 illustrates an exemplary flow diagram of a method 1000 for providing or fabricating a package. In some implementations, the method 1000 of FIG. 10 may be used to provide or fabricate any of the packages of the disclosure. For example, the method 1000 of FIG. 10 may be used to fabricate the package 800.

It should be noted that the method 1000 of FIG. 10 may combine one or more processes in order to simplify and/or clarify the method for providing or fabricating a package. In some implementations, the order of the processes may be changed or modified. In some implementations, one or more of processes may be replaced or substituted without departing from the scope of the disclosure. The method 1000 of FIG. 10 may be used to fabricate one package or several packages at a time (as part of a wafer and/or a panel).

The method provides (at 1005) a carrier. In some implementations, the carrier may be provided with an adhesive. Stage 1 of FIG. 9A, illustrates and describes an example of providing a carrier 500 and an adhesive coat 501. The adhesive coat 501 may be an adhesive layer that is located over a surface of the carrier 500.

The method places (at 1010) a front side of a first integrated device and a front side of second integrated device over the carrier. In some implementations, the front side of the integrated device(s) is placed over a carrier that includes and adhesive. In some implementations, two or more integrated devices may be placed over the carrier. Stage 2 of FIG. 9A, illustrates and describes an example of an integrated device 403 and an integrated device 405 that are placed on the carrier 500 and the adhesive coat 501. A pick and place process may be used to place the integrated device. The front side of the integrated device 403 and the integrated device 405 may be placed on the carrier 500 and the adhesive coat 501.

The method forms (at 1015) an encapsulation layer that encapsulates the integrated devices. The encapsulation layer may be coupled to the integrated devices and the carrier. Stage 3 of FIG. 9A, illustrates and describes an example of an encapsulation layer 106 that is formed over the carrier 500, the adhesive coat 501, the integrated device 403 and the integrated device 405. The encapsulation layer 106 may encapsulate the integrated device 403 and the integrated device 405. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process. In some implementations, once the encapsulation layer 106 is provided, portions of the encapsulation layer 106 may be removed. For example, a grinding process may be used to remove a top portion of the encapsulation layer 106, a back side of the integrated device 403 and/or a back side of the integrated device 405.

The method decouples (at 1020) the carrier from the encapsulation layer and the integrated devices. Stage 4 of FIG. 9A, illustrates and describes an example of the carrier 500 and the adhesive coat 501 that are decoupled from the integrated device 403, the integrated device 405 and the encapsulation layer 106. The carrier 500 and the adhesive coat 501 may be detached from the integrated device 403, the integrated device 405 and the encapsulation layer 106.

The method places (at 1025) a back side of the integrated devices and the encapsulation layer over another carrier (e.g., second carrier). The carrier may include an adhesive. Stage 5 of FIG. 9B, illustrates and describes an example of the integrated device 403, the integrated device 405 and the encapsulation layer 106 that are placed on a carrier 502. The back side of the integrated device 403 and the back side of the integrated device 405 may be placed and coupled to the carrier 502. There may be an adhesive coat on the carrier 502, that is similar to the adhesive coat 501. A pick and place process may be used to place the integrated device 403, the integrated device 405 and the encapsulation layer 106 on the carrier 502.

The method couples (at 1030) a bridge to the integrated devices. For example, the bridge 808 is coupled to the integrated device 403 and the integrated device 405. The bridge 808 may be coupled to the integrated device 403 and/or the integrated device 405 through hybrid bonding (e.g., copper to copper bonding, interconnect to interconnect bonding, metal to metal bonding) In some implementations, the bridge 808 may be coupled to the integrated device 403 and/or the integrated device 405 through at least a plurality of solder interconnects. The front side of the integrated device 403 and the front side of the integrated device 405 may face the bridge 808. The bridge 808 may include a bridge substrate 880 and a plurality of bridge interconnects 882. The bridge 808 may include at least one dielectric layer 884. In some implementations, the bridge 808 may be a silicon bridge. The bridge substrate 880 may include silicon. The plurality of bridge interconnects 882 may be coupled to the die pads (e.g., 430) of the integrated device 403 and the die pads (e.g., 450) of the integrated device 405. Stage 6 of FIG. 9B illustrates and describes an example of coupling a bridge to integrated devices.

The method forms (at 1035) a metallization portion that is coupled to the front side of the integrated devices and the encapsulation layer. The metallization portion may at least partially surround and/or encapsulate the bridge. The metallization portion may include at least one dielectric layer and a plurality of metallization interconnects. The plurality of metallization interconnects may include a first metallization interconnect on a first metal layer and a second metallization interconnect on a first metal layer, where the second interconnect has a second thickness that is different from a first thickness of the first metallization interconnect. Forming the metallization portion may include forming at least one dielectric layer and forming a first metallization interconnect on a first metal layer and a second metallization interconnect on a first metal layer. The second interconnect may have a second thickness that is different from a first thickness of the first metallization interconnect. Stage 7 of FIG. 9C illustrates and describes an example of a sequence for forming a metallization portion over the integrated devices and the bridge (e.g., 808). Stage 6 of FIG. 5B through Stage 26 of FIG. 5H illustrate examples of forming a metallization portion that is coupled to at least one integrated device. Different implementations may have different numbers of metal layers. Once the metallization portion is formed (at 1035), the method may decouple the second carrier from the integrated devices and the encapsulation layer.

The method couples (at 1040) a plurality of solder interconnects to the metallization interconnects of the metallization portion. Stage 9 of FIG. 9C, illustrates and describes an examples of a plurality of solder interconnects 110 that are coupled to the metallization portion 202. A solder reflow process may be used to couple the plurality of solder interconnects 110 to the plurality of metallization interconnects 222 of the metallization portion 202.

Exemplary Electronic Devices

Figure 11:
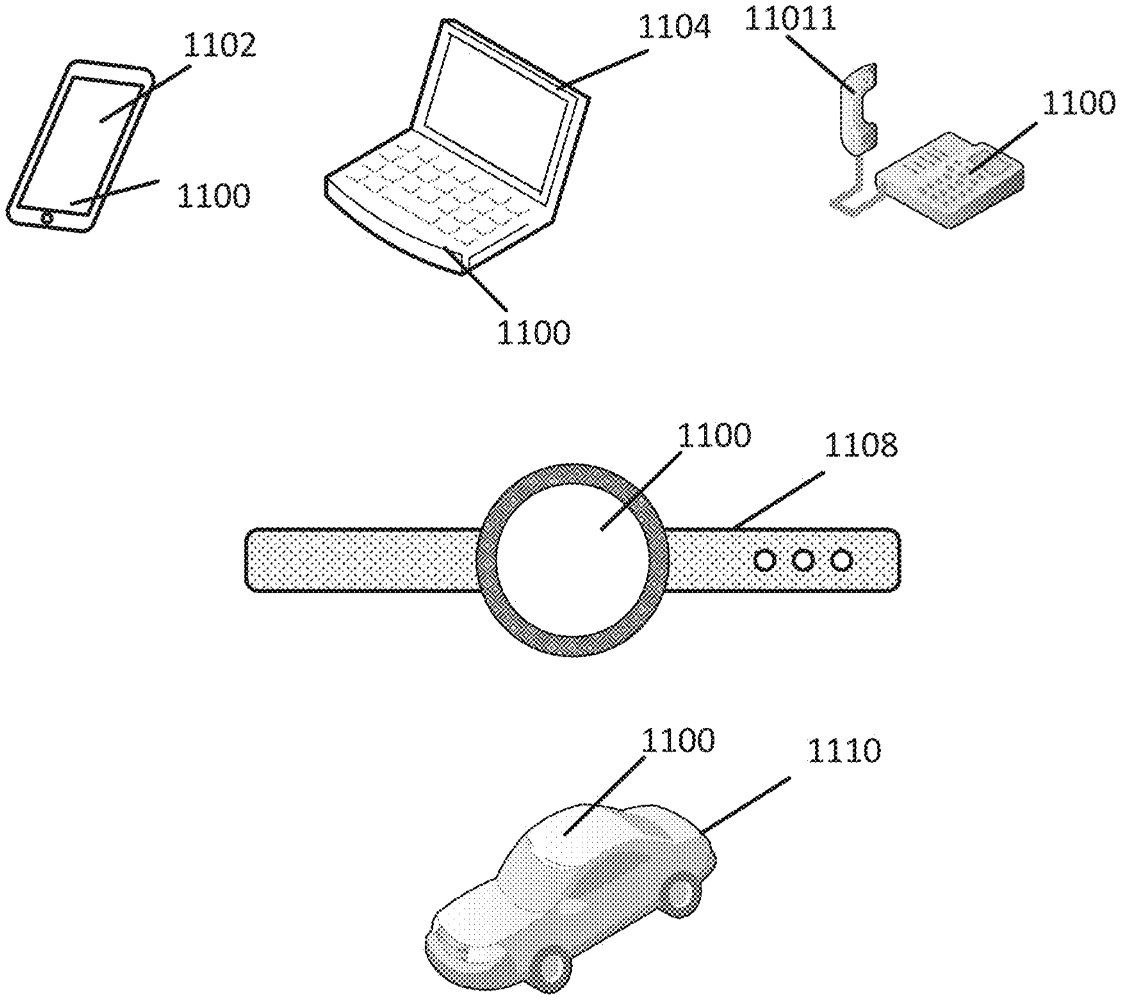
FIG. 11 illustrates various electronic devices that may integrate a die, an electronic circuit, an integrated device, an integrated passive device (IPD), a passive component, a package, and/or a device package described herein.

FIG. 11 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 1102, a laptop computer device 1104, a fixed location terminal device 1106, a wearable device 1108, or automotive vehicle 1110 may include a device 1100 as described herein. The device 1100 may be, for example, any of the devices and/or integrated circuit (IC) packages described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-4, 5A-5H, 6-8, 9A-9C and/or 10-11 may be rearranged and/or combined into a single component, process, feature or function or embodied in several components, processes, or functions. Additional elements, components, processes, and/or functions may also be added without departing from the disclosure. It should also be noted FIGS. 1-4, 5A-5H, 6-8, 9A-9C and/or 10-11 and its corresponding description in the present disclosure is not limited to dies and/or ICs. In some implementations, FIGS. 1-4, 5A-5H, 6-8, 9A-9C and/or 10-11 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects.

For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. A first component that is "located" in a second component may mean that the first component is "partially located" in the second component or "completely located" in the second component. A first component that is "embedded" in a second component may mean that the first component is "partially embedded" in the second component or "completely embedded" in the second component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising an integrated device; a substrate coupled to the integrated device through at least a first plurality of solder interconnects; and a metallization portion coupled to the substrate through at least a second plurality of solder interconnects. The metallization portion comprises at least one dielectric layer; and a plurality of metallization interconnects comprising a first metallization interconnect located on a first metal layer, wherein the first metallization interconnect includes a first thickness; and a second metallization interconnect located on the first metal layer, wherein the second metallization interconnect includes a second thickness that is different from the first thickness.

Aspect 2: The package of aspect 1, wherein the second thickness is greater than the first thickness.

Aspect 3: The package of aspect 2, wherein the second thickness is at least 1.2 times greater than the first thickness.

Aspect 4: The package of aspects 1 through 3, wherein the plurality of metallization interconnects comprise a third metallization interconnect located on a second metal layer; a fourth metallization interconnect located on the second metal layer; a first via metallization interconnect coupled to the first metallization interconnect and the third metallization interconnect, wherein the first via metallization interconnect comprises a first via height; and a second via metallization interconnect coupled to the second metallization interconnect and the fourth metallization interconnect, wherein the second via metallization interconnect comprises a second via height that is different from the first via height.

Aspect 5: The package of aspect 4, wherein the second thickness is greater than the first thickness, and wherein the first via height is greater than the second via height.

Aspect 6: The package of aspects 4 through 5, wherein the second metal layer is adjacent to the first metal layer.

Aspect 7: The package of aspects 4 through 6, wherein the first via metallization interconnect includes a first minimum diameter, and wherein the second via metallization interconnect includes a second minimum diameter that is greater than the first minimum diameter.

Aspect 8: The package of aspects 4 through 7, wherein the third metallization interconnect includes a third thickness, and wherein the fourth metallization interconnect includes a fourth thickness that is greater than the third thickness.

Aspect 9: The package of aspects 4 through 8, wherein the plurality of metallization interconnects comprise a fifth metallization interconnect located on a third metal layer, wherein the fifth metallization interconnect includes a fifth thickness; a sixth metallization interconnect located on the third metal layer, wherein the sixth metallization interconnect includes a sixth thickness that is greater than the fifth thickness; a third via metallization interconnect coupled to the fifth metallization interconnect and the third metallization interconnect, wherein the third via metallization interconnect comprises a third via height; and a fourth via metallization interconnect coupled to the sixth metallization interconnect and the fourth metallization interconnect, wherein the fourth via metallization interconnect comprises a fourth via height that is different from the third via height.

Aspect 10: The package of aspects 4 through 9, wherein the first metallization interconnect, the first via metallization interconnect and the third metallization interconnect are part of an electrical path for input/output signals to and/or from the integrated device, and wherein the second metallization interconnect, the second via metallization interconnect and the fourth metallization interconnect are part of an electrical path for power to the integrated device.

Aspect 11: The package of aspects 1 through 10, wherein the substrate includes an interposer comprising a plurality of interposer interconnects.

Aspect 12: The package of aspects 1 through 11, further comprising a second integrated device coupled to the substrate through at least a third plurality of solder interconnects, wherein the integrated device is a first chiplet, and wherein the second integrated device is a second chiplet.

Aspect 13: The package of aspect 12, wherein the plurality of metallization interconnects comprise a first plurality of metallization interconnects comprising a first minimum thickness, a first minimum spacing, a first minimum pitch and/or a first minimum width, wherein the first plurality of metallization interconnects include interconnects that vertically overlap with the first integrated device and the second integrated device; and a second plurality of metallization interconnects comprising a second minimum thickness, a second minimum spacing, a second minimum pitch and/or a second minimum width, wherein the metallization portion includes a redistribution portion, wherein the first metallization interconnect includes a first redistribution interconnect, and wherein the second metallization interconnect includes a second redistribution interconnect.

Aspect 14: A package comprising a first integrated device; a second integrated device; a bridge coupled to the first integrated device and the second integrated device; and a metallization portion coupled to the first integrated device and/or the second integrated device. The metallization portion comprises at least one dielectric layer; and a plurality of metallization interconnects comprising a first metallization interconnect located on a first metal layer, wherein the first metallization interconnect includes a first thickness; and a second metallization interconnect located on the first metal layer, wherein the second metallization interconnect includes a second thickness that is different from the first thickness.

Aspect 15: The package of aspect 14, wherein the second thickness is greater than the first thickness.

Aspect 16: The package of aspect 15, wherein the second thickness is at least 1.2 times greater than the first thickness.

Aspect 17: The package of aspects 14 through 16, wherein the plurality of metallization interconnects comprise a third metallization interconnect located on a second metal layer; a fourth metallization interconnect located on the second metal layer; a first via metallization interconnect coupled to the first metallization interconnect and the third metallization interconnect, wherein the first via metallization interconnect comprises a first via height; and a second via metallization interconnect coupled to the second metallization interconnect and the fourth metallization interconnect, wherein the second via metallization interconnect comprises a second via height that is different from the first via height.

Aspect 18: The package of aspect 17, wherein the second thickness is greater than the first thickness, and wherein the first via height is greater than the second via height.

Aspect 19: The package of aspects 17 through 18, wherein the first via metallization interconnect includes a first maximum diameter, and wherein the second via metallization interconnect includes a second maximum diameter that is less than the first maximum diameter.

Aspect 20: The package of aspects 14 through 19, wherein the bridge is located in the metallization portion.

Aspect 21: The package of aspect 20, wherein the bridge includes a silicon based bridge.

Aspect 22: The package of aspects 20 through 21, wherein the first integrated device and the second integrated device are configured to be electrically coupled to each other through an electrical path that includes the bridge.

Aspect 23: The package of aspects 20 through 22, wherein the bridge includes a silicon based bridge, wherein the first integrated device comprises a first technology node, and wherein the second integrated device comprises a second technology node.

Aspect 24: The package of aspects 14 through 23, wherein the plurality of metallization interconnects comprise a first plurality of metallization interconnects comprising a first minimum thickness, a first minimum spacing, a first minimum pitch and/or a first minimum width; and a second plurality of metallization interconnects comprising a second minimum thickness, a second minimum spacing, a second minimum pitch and/or a second minimum width.

Aspect 25: The package of aspect 24, wherein the first plurality of metallization interconnects include interconnects that vertically overlap with the first integrated device and the second integrated device.

Aspect 26: The package of aspects 14 through 25, wherein the package is implemented in a device is that is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:

a first integrated device;

a second integrated device;

a bridge comprising a plurality of bridge interconnects,
 wherein the bridge is coupled to the first integrated device and the second integrated device, and
 wherein the plurality of bridge interconnects of the bridge are coupled to and touch (i) interconnects of the first integrated device and (ii) interconnects of the second integrated device; and a metallization portion coupled to the first integrated device and the second integrated device, wherein the metallization portion comprises:
at least one dielectric layer; and
a plurality of metallization interconnects comprising:
a first metallization interconnect located on a first metal layer, wherein the first metallization interconnect includes a first thickness; and
a second metallization interconnect located on the first metal layer, wherein the second metallization interconnect includes a second thickness that is different from the first thickness.

2. The package of claim 1, wherein the second thickness is greater than the first thickness.

3. The package of claim 2, wherein the second thickness is at least 1.2 times greater than the first thickness.

4. The package of claim 1, wherein the plurality of metallization interconnects comprise:
a third metallization interconnect located on a second metal layer;
a fourth metallization interconnect located on the second metal layer;
a first via metallization interconnect coupled to the first metallization interconnect and the third metallization interconnect, wherein the first via metallization interconnect comprises a first via height; and
a second via metallization interconnect coupled to the second metallization interconnect and the fourth metallization interconnect, wherein the second via metallization interconnect comprises a second via height that is different from the first via height.

5. The package of claim 4,
wherein the second thickness is greater than the first thickness, and
wherein the first via height is greater than the second via height.

6. The package of claim 1, wherein the bridge is located at least partially in the metallization portion.

7. The package of claim 6, wherein the bridge includes a silicon based bridge.

8. The package of claim 6, wherein the first integrated device and the second integrated device are configured to be electrically coupled to each other through an electrical path that includes the bridge.

9. The package of claim 6, wherein the bridge includes a silicon based bridge,
wherein the first integrated device comprises a first technology node, and
wherein the second integrated device comprises a second technology node.

10. The package of claim 1, wherein the plurality of metallization interconnects comprise:
a first plurality of metallization interconnects comprising a first minimum thickness, a first minimum spacing, a first minimum pitch and/or a first minimum width; and
a second plurality of metallization interconnects comprising a second minimum thickness, a second minimum spacing, a second minimum pitch and/or a second minimum width.

11. The package of claim 10, wherein the first plurality of metallization interconnects include interconnects that vertically overlap with the first integrated device and the second integrated device.

12. The package of claim 1, wherein the package is implemented in a device that is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

13. A package comprising:
a first integrated device;
a second integrated device;
a bridge coupled to the first integrated device and the second integrated device; and
a metallization portion coupled to the first integrated device and the second integrated device, wherein the metallization portion comprises:
at least one dielectric layer; and
a plurality of metallization interconnects comprising:
a first metallization interconnect located on a first metal layer, wherein the first metallization interconnect includes a first thickness;
a second metallization interconnect located on the first metal layer, wherein the second metallization interconnect includes a second thickness that is different from the first thickness;
a third metallization interconnect located on a second metal layer;
a fourth metallization interconnect located on the second metal layer;
a first via metallization interconnect coupled to the first metallization interconnect and the third metallization interconnect,
wherein the first via metallization interconnect comprises a first via height, and
wherein the first via metallization interconnect includes a first maximum diameter, and
a second via metallization interconnect coupled to the second metallization interconnect and the fourth metallization interconnect,
wherein the second via metallization interconnect comprises a second via height that is different from the first via height, and
wherein the second via metallization interconnect includes a second maximum diameter that is less than the first maximum diameter.

14. A package comprising:
a first integrated device;
a second integrated device;
a bridge comprising a plurality of bridge interconnects,
wherein the bridge is coupled to the first integrated device through a first plurality of solder interconnects,
wherein the first plurality of solder interconnects touch (i) interconnects of the first integrated device and (ii) a first plurality of bridge interconnects of the bridge,
wherein the bridge is coupled to the second integrated device through a second plurality of solder interconnects, and
wherein the second plurality of solder interconnects touch (i) interconnects of the second integrated device and (ii) a second plurality of bridge interconnects of the bridge,
a metallization portion coupled to the first integrated device and the second integrated device, wherein the metallization portion comprises:
at least one dielectric layer; and
a plurality of metallization interconnects comprising:
a first metallization interconnect located on a first metal layer, wherein the first metallization interconnect includes a first thickness; and a second metallization interconnect located on the first metal layer, wherein the second metallization interconnect includes a second thickness that is different from the first thickness.

* * * * *